(12) United States Patent
Sakuragi et al.

(10) Patent No.: US 9,225,882 B2
(45) Date of Patent: Dec. 29, 2015

(54) ELECTRONIC COMPONENT PACKAGING THAT CAN SUPPRESS NOISE AND ELECTRONIC APPARATUS

(71) Applicant: CANON KABUSHIKI KAISHA, Tokyo (JP)

(72) Inventors: Takamasa Sakuragi, Machida (JP); Takanori Suzuki, Tokyo (JP); Koji Tsuduki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/189,854

(22) Filed: Feb. 25, 2014

(65) Prior Publication Data
US 2014/0240588 A1 Aug. 28, 2014

(30) Foreign Application Priority Data

Feb. 28, 2013 (JP) ................................ 2013-039448

(51) Int. Cl.
*H04N 5/225* (2006.01)
*H01L 27/146* (2006.01)
*H01L 21/02* (2006.01)

(52) U.S. Cl.
CPC ........... *H04N 5/2252* (2013.01); *H04N 5/2253* (2013.01); *H01L 2224/48091* (2013.01); *H01L 2224/48227* (2013.01); *H01L 2224/73265* (2013.01)

(58) Field of Classification Search
CPC ... H04N 5/225; H04N 5/2254; H01L 31/0216
USPC .................. 348/340; 257/435, 532, 659, 774
See application file for complete search history.

(56) References Cited

U.S. PATENT DOCUMENTS

| 5,639,989 A | 6/1997 | Higgins, III |
| 5,864,088 A | 1/1999 | Sato et al. |
| 8,508,950 B2 | 8/2013 | Chen et al. |
| 2003/0132494 A1 | 7/2003 | Tuttle |
| 2003/0231093 A1 | 12/2003 | Hsu |
| 2005/0275061 A1 | 12/2005 | Ohguro |
| 2007/0278628 A1 | 12/2007 | Katti |
| 2008/0292308 A1 | 11/2008 | Iwabuchi |
| 2011/0205414 A1 | 8/2011 | Mochiduki et al. |
| 2011/0304015 A1 | 12/2011 | Kim |
| 2011/0304763 A1* | 12/2011 | Choi et al. .................... 348/340 |

FOREIGN PATENT DOCUMENTS

| JP | H01-299094 A | 12/1989 |
| JP | H11284163 A | 10/1999 |
| JP | 2003101042 A | 4/2003 |
| JP | 2003282754 A | 10/2003 |
| JP | 2004022955 A | 1/2004 |
| JP | 2004031815 A | 1/2004 |
| JP | 2004-335638 A | 11/2004 |
| JP | 2006-310433 A | 11/2006 |
| JP | 2008245244 A | 10/2008 |

(Continued)

*Primary Examiner* — Kelly L Jerabek
(74) *Attorney, Agent, or Firm* — Canon U.S.A., Inc. IP Division

(57) ABSTRACT

A ferromagnetic body is provided at a front-surface side of a reference plane and located outside a region that overlaps an electronic device in a direction perpendicular to the reference plane, and a conductor is provided at a back-surface side of the reference plane and that overlaps the electronic device in the direction perpendicular to the reference plane.

20 Claims, 11 Drawing Sheets

(56) References Cited

FOREIGN PATENT DOCUMENTS

| | | |
|---|---|---|
| JP | 2011-035458 A | 2/2011 |
| JP | 2011054643 A | 3/2011 |
| JP | 2011-181730 A | 9/2011 |
| JP | 2011176224 A | 9/2011 |
| JP | 2012-220419 A | 11/2012 |
| JP | 2013-039448 A | 2/2013 |
| RU | 2325780 C2 | 5/2008 |
| RU | 2448390 C2 | 4/2012 |
| WO | 2010/146863 A1 | 12/2010 |

* cited by examiner

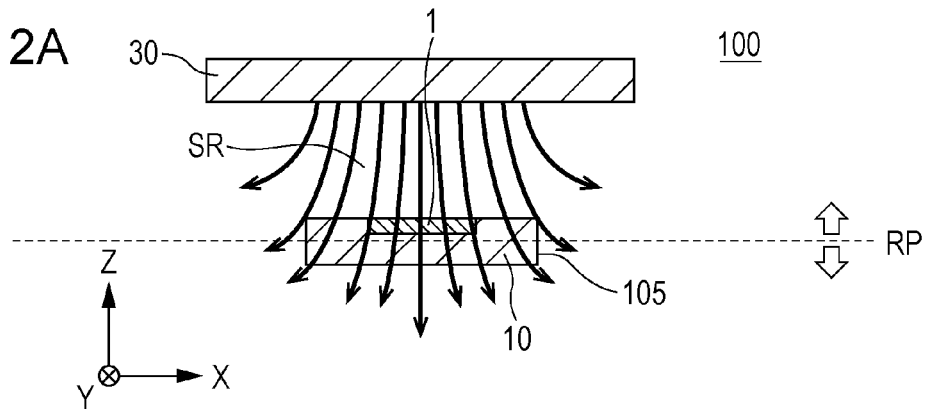
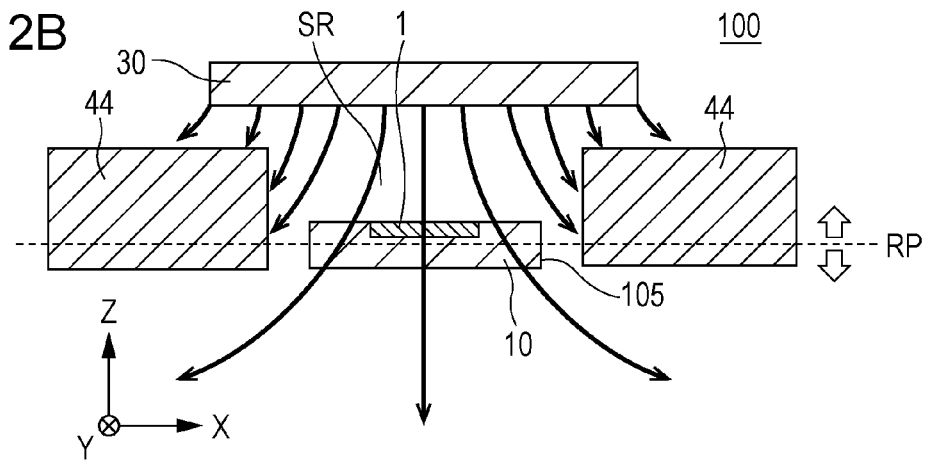
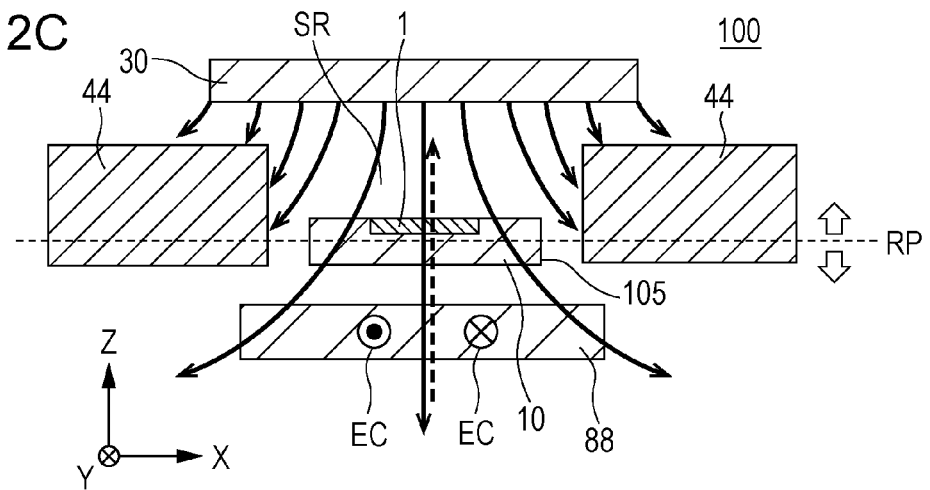

ELECTRONIC COMPONENT PACKAGING THAT CAN SUPPRESS NOISE AND ELECTRONIC APPARATUS

BACKGROUND OF THE INVENTION

1. Field of the Invention

The present invention relates to a package structure of an electronic component including an electronic device.

2. Description of the Related Art

Image pickup apparatuses included in image pickup systems, such as cameras, are generally exposed to a magnetic field generated by various causes. When an image pickup device included in such an image pickup apparatus is affected by the magnetic field, noise is generated in the images and the image quality may be reduced.

Japanese Patent Laid-Open No. 11-284163 discloses a configuration in which a counter magnetic field corresponding to the external magnetic field is formed by an induced current generated in a loop of a conductor, and in which the external magnetic field is canceled by this counter magnetic field. Japanese Patent Laid-Open No. 2003-101042 discloses an optical semiconductor apparatus including a metal frame body made of a metal material, such as an iron-nickel-cobalt alloy or an iron-nickel alloy. Japanese Patent Laid-Open No. 2008-245244 discloses an image pickup element package including a support member to which a main-portion member made of a fired ceramic material and an attachment member made of Kovar are bonded.

The counter magnetic field based on the induced current described in Japanese Patent Laid-Open No. 11-284163 is formed only in the immediate vicinity of the loop. Therefore, in an image pickup device including a large-area image pickup portion that is advantageous for achieving high image quality, the magnetic field applied to the image pickup device cannot be sufficiently reduced. Accordingly, the present invention provides an electronic component in which noise generated in an electronic device, such as image pickup device, is suppressed.

SUMMARY OF THE INVENTION

According to an aspect of the present invention, an electronic component comprises an electronic device, a plane which is located between a front surface and a back surface of the electronic device and extends through a side surface of the electronic device without extending through the front surface or the back surface, is defined a reference plane. The electronic component comprises a lid body that is provided at the front-surface side of the reference plane and that overlaps the electronic device in a direction perpendicular to the reference plane, a base body that is provided at the back-surface side of the reference plane and to which the electronic device is fixed with a bonding material, a ferromagnetic body that is provided at the front-surface side of the reference plane and located outside a region that overlaps the electronic device in a direction perpendicular to the reference plane, and a conductor that is provided at the back-surface side of the reference plane and that overlaps the electronic device in the direction perpendicular to the reference plane.

Further features of the present invention will become apparent from the following description of exemplary embodiments with reference to the attached drawings.

BRIEF DESCRIPTION OF THE DRAWINGS

FIGS. 2A to 2C are schematic diagrams illustrating magnetic fields applied to the electronic component.

DESCRIPTION OF THE EMBODIMENTS

Figure 1:
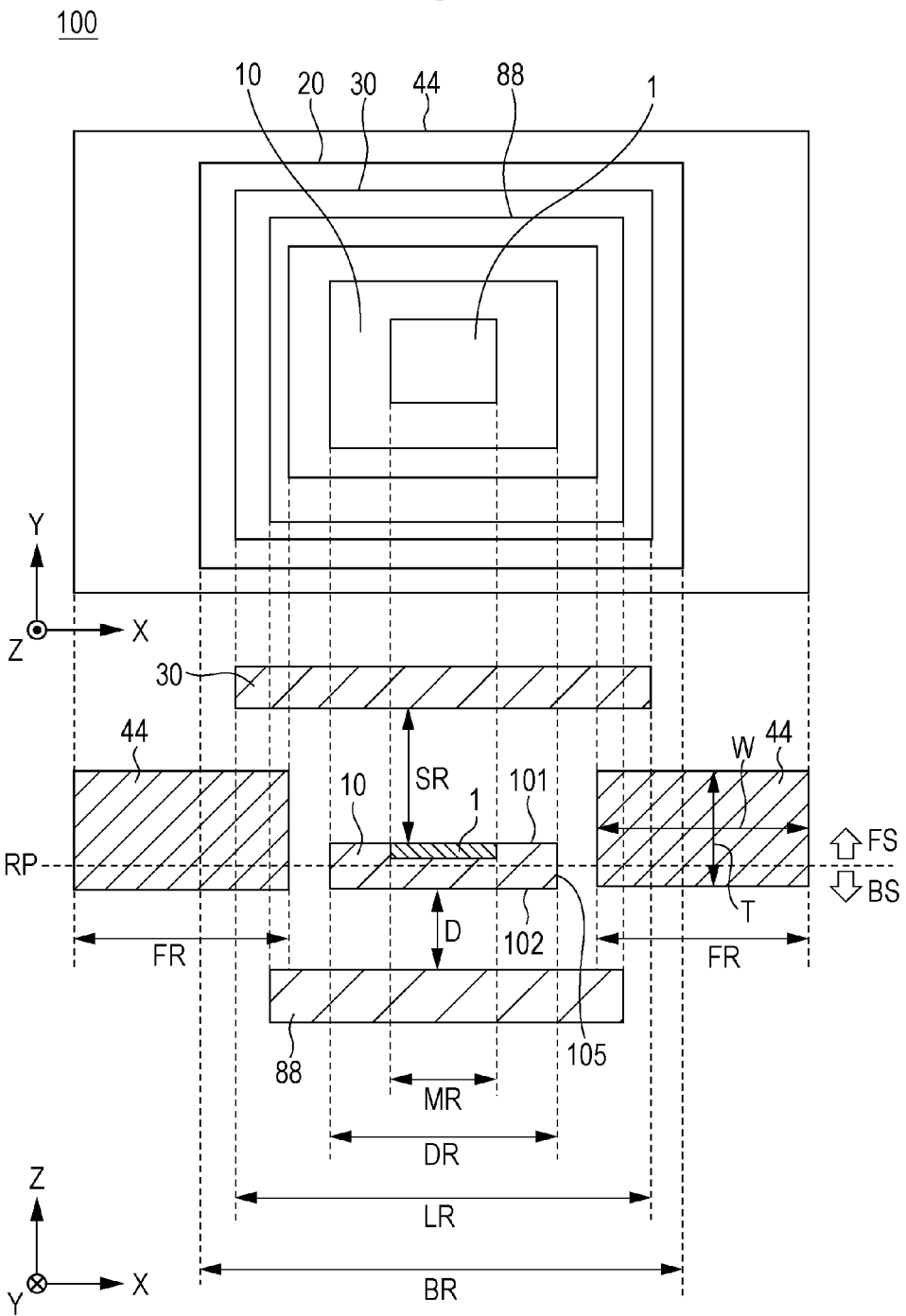
FIG. 1 is a schematic diagram illustrating an example of an electronic device.

An embodiment of the present invention will now be described with reference to the drawings. In the figures, the same components are denoted by the same reference numerals, and descriptions thereof will not be given for each figure. Each figure shows X, Y, and Z directions.

First, the schematic structure according to the embodiment will be described. FIG. 1 illustrates an X-Y plane view and an X-Z sectional view showing the positional relationship between the components included in an electronic component 100. The electronic component 100 includes an electronic device 10 and a ferromagnetic body 44. The electronic component 100 may further include a base body 20 and a lid body 30. The electronic component 100 may further include a conductor 88, which will be described in detail below. With regard to the base body 20, the lid body 30, and the conductor 88, only the outlines thereof are shown in the plane view. The base body 20 is not shown in the sectional view. The specific shape of the base body 20 will be described below.

The electronic device 10 includes a main portion 1, which has the main function. The electronic device 10 is a plate-shaped member having a front surface 101, a back surface 102, and side surfaces 105. The electronic device 10 is fixed to the base body 20. In the plane view of FIG. 1, only the outline of the base body 20 is shown. The lid body 30 faces the electronic device 10. The back surface 102 of the electronic device 10 serves as a fixing surface that is fixed to the base body 20 with other members. FIG. 1 shows a reference plane RP, which is an imaginary plane that is located between the front surface 101 and the back surface 102 and extends through the side surfaces 105. Thus the reference plane RP does not extend through the front surface 101 and the back surface 102. The front surface 101 is located at one side (front-surface side FS) of the reference plane RP, and the back surface 102 is located at the other side (back-surface side BS) of the reference plane RP. The reference plane RP extends in the X and Y directions, and a direction perpendicular to the reference plane RP is the Z direction. In the case where the electronic device 10 is a semiconductor device, the reference plane RP may be set to an interface between a semiconductor layer and an insulating layer for convenience.

As illustrated in the sectional view, the ferromagnetic body 44 is at the front-surface-101 side FS of the electronic device 10 with respect to the reference plane RP. In this example, the ferromagnetic body 44 extends to the rear-surface-102 side BS of the electronic device 10 with respect to the reference plane RP. As illustrated in the sectional view, the ferromagnetic body 44 surrounds at least one of (1) a region SR between the electronic device 10 and the lid body 30 and (2) the electronic device 10 (both in the example illustrated in FIG. 1). As is clear from the plane view, the ferromagnetic body 44 may be a frame-shaped member (frame body). In this example, the ferromagnetic body 44 is a plate-shaped member having a width W greater than the thickness T thereof. However, the ferromagnetic body 44 may instead be a tube-shaped member having a thickness T greater than the width W thereof. Here, the thickness is a dimension of the ferromagnetic body 44 in the Z direction, which is a direction perpendicular to the principal surfaces (the front surface 101 and the back surface 102) of the electronic device 10. The width W is a dimension of the ferromagnetic body 44 in a plane extending in the X and Y directions, which are directions parallel to the principal surfaces (the front surface 101 and the back surface 102) of the electronic device 10. The width of the ferromagnetic body 44 that is a frame body is the distance between the outer edge and inner edge of the frame body. At least a portion of the ferromagnetic body 44 is located in an orthogonal projection region BR of the base body 20. In this example, the ferromagnetic body 44 extends a region outside the orthogonal projection region BR of the base body 20. The orthogonal projection region will now be described. An orthogonal projection region of a certain member is a region in which the member is projected in the Z direction, which is a direction perpendicular to the reference plane RP. With regard to a positional relationship between arbitrary two members (e.g. first and second members), when at least a portion of the first member is located in the orthogonal projection region of a second member, it means that the first and second members overlap in the Z direction. In other words, when at least a portion of the first member is located in the orthogonal projection region of the second member, it can be said that the first member is located in a region that overlaps the second member in the Z direction. Conversely, when at least a portion of a first member is located outside an orthogonal projection region of a second member, it can be said that at least a portion of the first member is located in a region that does not overlap the second member. For example, a portion of the lid body 30, which faces the electronic device 10, is located in a region DR that overlaps the electronic device 10 in the Z direction. The region DR is the orthogonal projection region of the electronic device 10. The boundaries between the inside and outside of an orthogonal projection region of a certain member correspond to the outer and inner edges of the member that define the outline of the member (there may be a case where there is no inner edge).

The ferromagnetic body 44 may be a soft magnetic body rather than a hard magnetic body. This is because although the ferromagnetic body 44 is capable of reducing the external magnetic field applied to the electronic device 10, it is not desirable that the ferromagnetic body 44 itself be a source of a magnetic field.

As described above, the electronic component 100 may further include the conductor 88. At least a portion of the conductor 88 is located in the orthogonal projection region DR of the electronic device 10. The conductor 88 also extends to a region outside the orthogonal projection region DR of the electronic device 10. In addition, the conductor 88 extends into an orthogonal projection region FR of the ferromagnetic body 44. In the orthogonal projection region DR of the electronic device 10, the conductor 88 may be continuous over ½ or more of the area of the orthogonal projection region DR of the electronic device 10. The conductor 88 is a film-shaped or plate-shaped member. At least a portion of the conductor 88 may be located in an orthogonal projection region MR of the main portion 1 of the electronic device 10, and the conductor 88 may be continuous over ¼ or more of the area of the orthogonal projection region MR. As illustrated in the sectional view, the conductor 88 is located at the back-surface-102 side BS of the electronic device 10 with respect to the reference plane RP. In other words, the conductor 88 is arranged so as to face the lid body 30 across the electronic device 10.

The magnetic permeability of the conductor 88 may be lower than that of the ferromagnetic body 44. The conductor 88 may be a non-ferromagnetic body. The non-ferromagnetic body may be a material that is paramagnetic or diamagnetic (paramagnetic or diamagnetic body). The relative magnetic permeability of the ferromagnetic body 44 is typically 100 or more. The relative magnetic permeability of the conductor 88 is typically 10 or less, and more typically, 1.0. The material of the conductor 88 is not particularly limited as long as the material is conductive, and may be, for example, a metal material such as aluminum, stainless steel, or a copper alloy, or a conductive metal oxide such as ITO or $SnO_2$. The conductor 88 may be a plate made by casting or forging, a film formed by vapor deposition or plating, or a film obtained by forming a coating film made of metal paste or metal oxide paste and burning the coating film. The electrical conductivity of the conductor 88 may be in the range of $1 \times 10^6$ (S/m) or more, and preferably $1 \times 10^7$ (S/m) or more. In particular, copper may be used since copper has an electrical conductivity of about $6 \times 10^7$ (S/m) and is diamagnetic.

The conductor 88 may either be in contact with or separated from the electronic device 10. For example, the distance D between the conductor 88 and the electronic device 10 may be 0.10 mm or more. The distance D between the conductor 88 and the electronic device 10 may be 1.0 mm or less.

FIGS. 2A to 2C are schematic diagrams illustrating the operations of the ferromagnetic body 44 and the conductor 88 in the electronic component 100. The electronic component 100 may be exposed to an external magnetic field. Although the external magnetic field may be due to the environment in which the electronic apparatus including the electronic component is used, it may instead be due to a magnetic field generated in the electronic apparatus. In this case, the electronic device 10 is close to the source of the magnetic field and is likely to be exposed to a strong magnetic field. More specifically, a magnetic field that varies over time, which is generated by an electromagnet included in the electronic apparatus or a coil of a radio communication component, causes a problem. Such a magnetic field is generated by, for example, a coil of a driving motor for moving a camera lens during auto-focusing or a coil of a driving actuator used to prevent motion blurring. In FIGS. 2A to 2C, a source of an external magnetic field is assumed to be a point. The magnetic field mainly extends in a direction perpendicular to a light-receiving surface (Z direction), but also extends in directions parallel to the light receiving surface (X and Y directions). Thus, the magnetic field includes X-direction and Y-direction components. In FIG. 2A, the arrows with solid lines show the magnetic lines of force of the external magnetic field in the case where neither the ferromagnetic body 44 nor the conductor 88 is provided. Nine out of eleven magnetic lines of force drawn in FIG. 2A extend through the electronic device 10, and five of the nine magnetic lines of force extend through the main portion 1.

In contrast, as illustrated in FIG. 2B, when the ferromagnetic body 44 is provided, the magnetic lines of force is attracted to the ferromagnetic body 44 so that the number of magnetic lines of force that extend through the electronic device 10 is reduced to three and the number of magnetic lines of force that extend through the main portion 1 is reduced to one. In other words, the magnetic flux density in the electronic device 10 is reduced by the ferromagnetic body 44. As a result, noise due to an induced electromotive force or an induced current generated in wires of the electronic device 10 when the magnetic field varies can be reduced.

The magnetic field varies in accordance with the shapes of the surfaces of the ferromagnetic body 44, in particular, the shapes of the upper and side surfaces of the ferromagnetic body 44. The side surfaces of the ferromagnetic body 44, that is, the surfaces facing the region SR and the side surfaces 105 of the electronic device 10, serve to increase the X-direction and Y-direction components of the magnetic field in the vicinity of the electronic device 10, thereby pulling the magnetic field away from the electronic device 10 and toward the ferromagnetic body 44. The upper surface of the ferromagnetic body 44 moves the magnetic lines of force away from the region SR while suppressing an increase in the X-direction and Y-direction components of the magnetic field in the vicinity of the electronic device 10. Therefore, to form an appropriate magnetic field distribution, it is effective to reduce surface area of the ferromagnetic body 44 that extend in the Z direction, that is, the side surfaces of the ferromagnetic body 44. And also it is effective to increase a surface area of the ferromagnetic body 44 that extends in the X and Y directions, that is, the upper surface of the ferromagnetic body 44. For this reason, the ferromagnetic body 44 may be a plate-shaped frame body having a width W greater than the thickness T thereof, as illustrated in FIG. 1. The amount by which the external magnetic field is pulled is increased as the volume of the ferromagnetic body 44 is increased. The volume of a single ferromagnetic body 44 may be 10 $mm^3$ or more, and is preferably 100 $mm^3$ or more.

Of course, the closer the ferromagnetic body 44 is to the electronic device 10, the more appropriately the magnetic field in the vicinity of the electronic device 10 can be attracted to the ferromagnetic body 44. Therefore, at least a portion of the ferromagnetic body 44 may be disposed in the orthogonal projection region of the base body 20 (region corresponding to the region BR in FIG. 1). When the ferromagnetic body 44 extends to a region outside the orthogonal projection region of the base body 20 (region corresponding to the region BR in FIG. 1), the magnetic flux density in the vicinity of the electronic device 10 can be efficiently reduced while an increase in the size of the base body 20 is restricted.

In addition, as illustrated in FIG. 2C, when the conductor 88 is provided, the three magnetic lines of force that extend through the electronic device 10 generate an eddy current EC in the conductor 88. The eddy current EC generates a magnetic field (counter magnetic field) in the orientation opposite to the orientation of the external magnetic field in the Z direction. The magnetic lines of force generated by the eddy current EC are shown by the arrows with broken lines. The external magnetic field and the magnetic field generated by the eddy current EC cancel each other, so that the magnetic field that extends through the electronic device 10 can be reduced. The magnetic field generated by the eddy current EC extends only in the normal direction to the conductor 88. Therefore, the Z-direction component of the magnetic field can be reduced while the X-direction and Y-direction components of the magnetic field are barely increased. When the conductor 88 extends to the orthogonal projection region of the ferromagnetic body 44 (region corresponding to the region FR in FIG. 1), the magnetic flux density in the space between the conductor 88 and the electronic device 10 can be effectively reduced. In particular, a portion of the conductor 88 may be located below connecting conductors, such as bonding wires, and inner terminals to which the connecting conductors are connected. This is because generation of magnetic noise in signals transmitted through the connecting conductors and the inner terminals can be suppressed by the conductor 88 disposed below the connecting conductors and the inner terminals.

The type of the electronic device 10 included in the electronic component 100 is not particularly limited. The electronic device 10 may be, for example, an optical device such as an image pickup device or a display device. In this example, the electronic device 10 includes the main portion 1 and a sub-portion 2. Typically, the main portion 1 is located in a central region of the electronic device 10, and the sub-portion 2 is located around the main portion 1. In the case where the electronic device 10 is an image pickup device such as a CCD image sensor or a CMOS image sensor, the main portion 1 is an image pickup unit. In the case where the electronic device 10 is a display device such as a liquid crystal display or an EL display, the main portion 1 is a display unit. In the case of an image pickup device, the front surface 101 of the electronic device 10 that faces the lid body 30 serves as a light incident surface. The light incident surface may be a surface of the outermost layer of a multilayer film disposed on a semiconductor substrate having a light-receiving surface. The multilayer film includes layers having optical functions, such as a color filter layer, a microlens layer, an antireflection layer, and a light shielding layer, layers having mechanical functions, such as a flatting layer, and layers having chemical functions, such as a passivation layer. The sub-portion 2 includes driving circuits for driving the main portion 1 and signal processing circuits for processing signals transmitted from the main portion 1 (or signals transmitted to the main portion 1). In the case where the electronic device 10 is a semiconductor element, these circuits can be easily formed in a monolithic structure. The sub-portion 2 further includes electrodes 3 (electrode pads) for communicating signals between the electronic device 10 and an external device. An image pickup device will now be described as an example of the electronic device 10.

Figure 3:
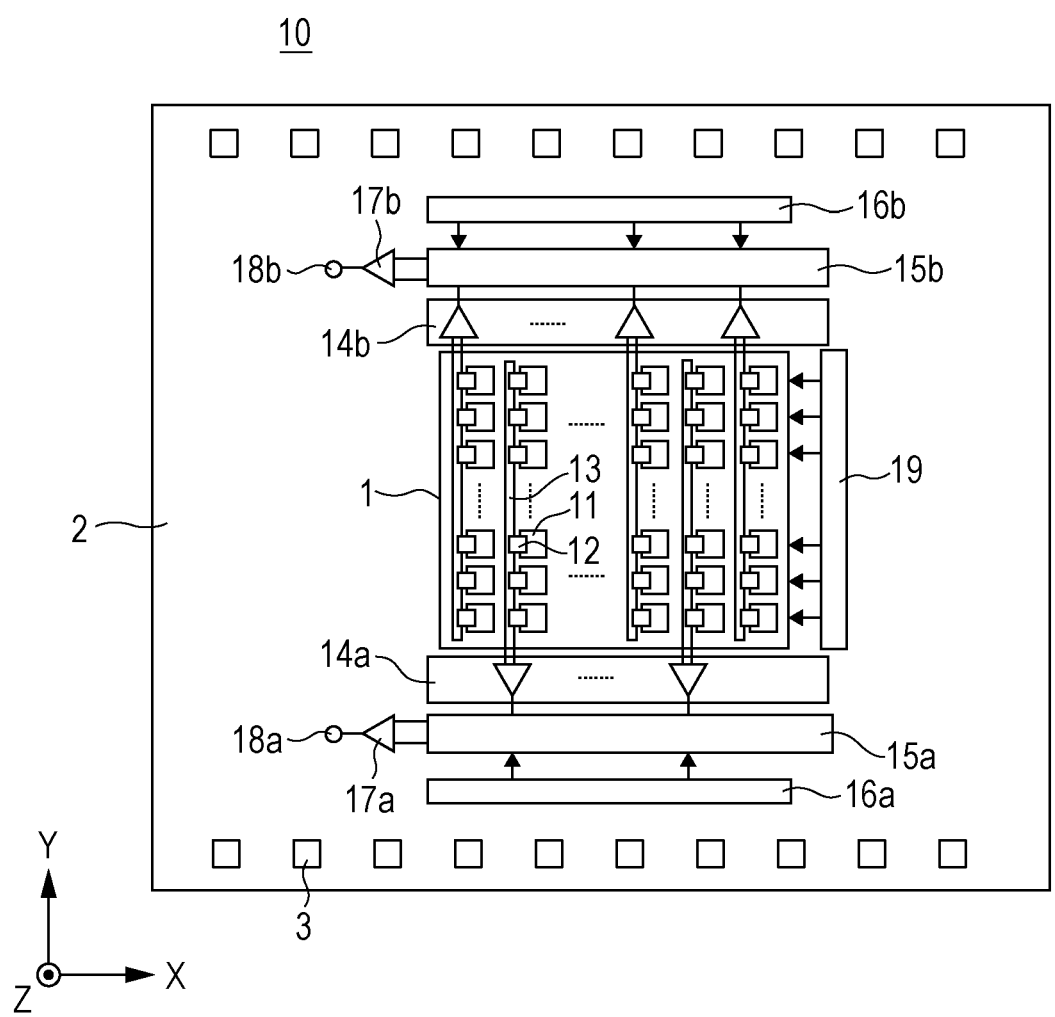
FIG. 3 is a schematic plane view illustrating an example of an electronic device.

FIG. 3 is a block diagram illustrating an image pickup device as an example of the electronic device 10. The main portion 1, which is as an image pickup unit, includes a plurality of photoelectric converters 11 (photodiodes) arranged in a matrix pattern. Each photoelectric converter 11 includes a signal generating circuit (pixel circuit) 12 including a transfer gate, an amplifier transistor, and a reset transistor. The signal generating circuits 12 are successively driven by a horizontal scanning circuit 19 in units of rows. The signals obtained by the signal generating circuits 12 are output to the reading circuits 14a and 14b through the signal output lines 13. The reading circuits 14a and 14b include column amplification circuits and memories that store signals amplified by the column amplification circuits. The signals from the reading circuits 14a and 14b are transmitted to the reading amplifiers 17a and 17b through the signal transmitters 15a and 15b driven by the vertical scanning circuits 16a and 16b. The signals amplified by the reading amplifiers 17a and 17b are output from the appropriate electrode pads 3 through the output units 18a and 18b. In this example, two equivalent groups of peripheral circuits are arranged above and below the main portion 1. The reading circuits 14a and 14b and the reading amplifiers 17a and 17b are included in the above-described signal processing circuits, and the vertical and horizontal scanning circuits are included in the above-described driving circuits.

Figure 4A:
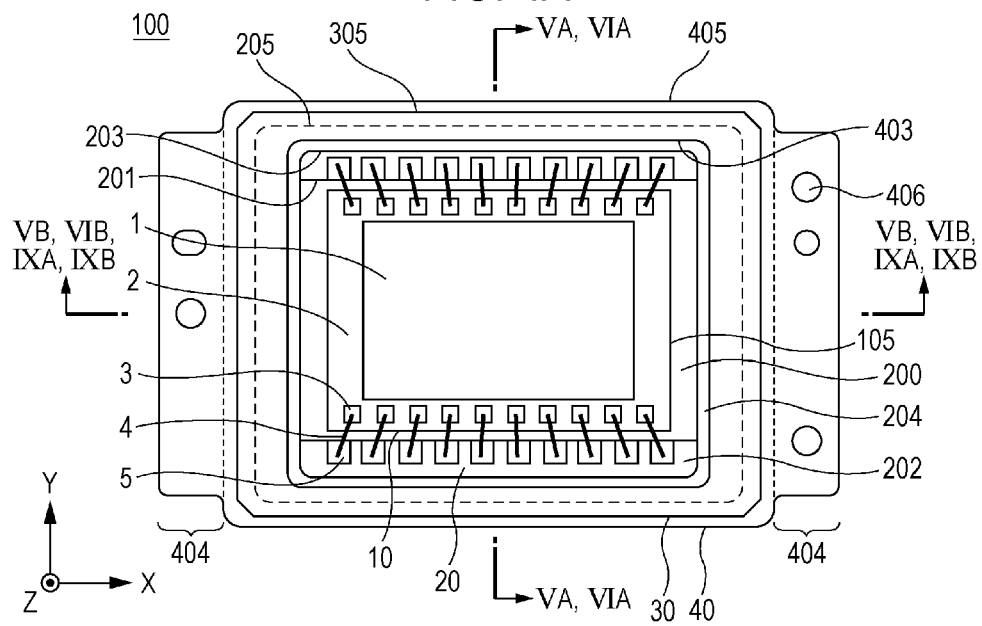
FIGS. 4A and 4B are schematic plane views illustrating an example of the electronic component.
Figure 4B:
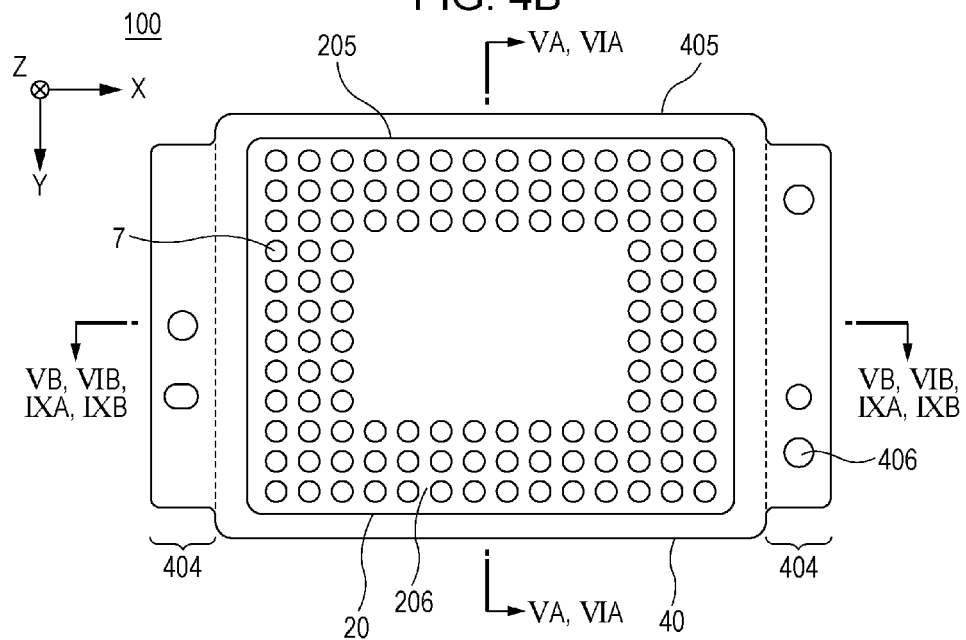
Figure 5A:
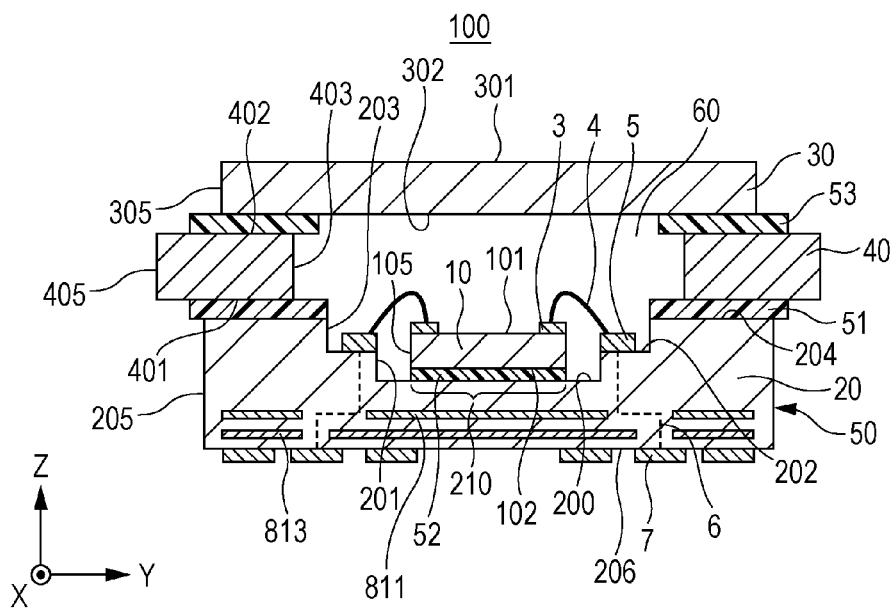
FIGS. 5A and 5B are schematic sectional views illustrating an example of the electronic component.
Figure 5B:
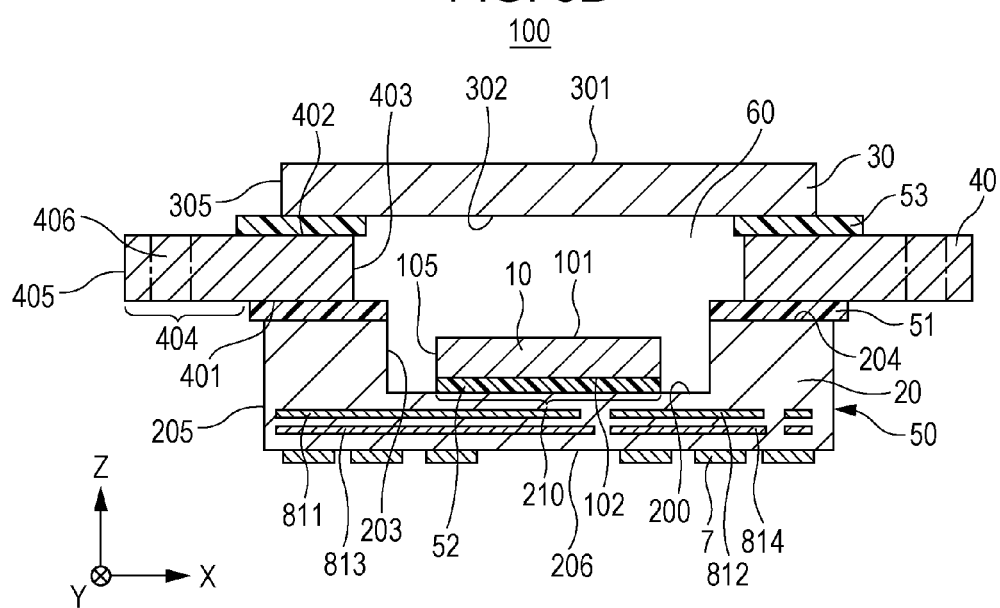

An example of the electronic component 100 will now be described. FIG. 4A is a schematic plane view of the electronic component 100 viewed from the front, and FIG. 4B is a schematic plane view of the electronic component 100 viewed from the back. FIGS. 5A and 5B are schematic sectional views of the electronic component 100. FIG. 5A is a sectional view of the electronic component 100 taken along line VA-VA in FIGS. 4A and 4B, and FIG. 5B is a sectional view of the electronic component 100 taken along line VB-VB in FIGS. 4A and 4B.

The electronic component 100 includes the electronic device 10 and a container 50 that contains the electronic device 10. The container 50 basically includes the base body 20, the lid body 30, and a frame body 40. In this embodiment, the frame body 40 serves as the above-described ferromagnetic body. As described in detail below, the base body 20 and the frame body 40 included in the container 50 may function as mounting members. The lid body 30 may function as an optical member. The electronic device 10 is fixed to the base body 20 with another member provided therebetween. The lid body 30 is fixed to the base body 20 with the frame body 40 provided therebetween, and faces the electronic device 10 with an interior space 60 provided therebetween. The frame body 40 surrounds the interior space 60 between the lid body 30 and the electronic device 10. The interior space 60 corresponds to the region SR in FIG. 1. In this embodiment, the conductor 88 illustrated in FIG. 1 is provided. In this embodiment, the conductor 88 illustrated in FIG. 1 includes conductive films 811, 812, 813, and 814 embedded in the base body 20.

The X direction and the Y direction are parallel to the front surface 101 of the electronic device 10 that faces the lid body 30, the back surface 102 at the side opposite to the front-surface-101 side, an outer surface 301 of the lid body 30, and an inner surface 302 of the lid body 30. The Z direction is perpendicular to the front surface 101, the back surface 102, the outer surface 301, and the inner surface 302. The orthogonal projections of the electronic device 10 and the electronic component 100 on a plane including the X and Y directions are typically rectangular. The dimensions of the electronic device 10 and the electronic component 100 in the Z direction are smaller than those in the X and Y directions. In other words, the electronic device 10 and the electronic component 100 are typically plate-shaped. In the following description, the dimension in the Z direction may be referred to as a thickness or height for convenience.

In a projection onto a plane including the X and Y directions, the outer edge of the electronic component 100 is defined by an outer edge 205 of the base body 20, an outer edge 405 of the frame body 40, and an outer edge 305 of the lid body 30. The frame body 40 has an inner edge 403 in addition to the outer edge 405.

At least a portion of a central region of the base body 20 serves as an arrangement region 210. The electronic device 10 is disposed above the arrangement region 210, and is fixed to the base body 20. As illustrated in FIGS. 5A and 5B, the electronic device 10 is typically fixed to the base body 20 by a bonding material 52 interposed between the arrangement region 210 of the base body 20 and the back surface 102 of the electronic device 10. The bonding material 52 may instead be provided only on the outer edge 105, that is, on the side surfaces of the electronic device 10. The bonding material 52 may either be conductive or insulative. The bonding material 52 may have a high thermal conductivity and contain metal particles. The bonding material 52 that is conductive may function as the above-described conductor 88.

The base body 20 includes inner terminals 5 that face the inside of the container 50 (interior space 60) and outer terminals 7 that face the outside of the container 50. The inner terminals 5 are arranged next to each other to form inner terminal groups. In this example, as illustrated in FIG. 4A two rows (groups) of inner terminals 5, each row including ten inner terminals 5 that are aligned in the X direction, are arranged in the Y direction. The arrangement of the inner terminals 5 is not limited to this, and two rows of inner terminals 5 aligned in the Y direction may instead be arranged in the X direction. Alternatively, two rows of inner terminals 5 aligned in the Y direction and two rows of inner terminals 5 aligned in the X direction may be provided so that the inner terminals 5 surround the electronic device 10. As illustrated in FIG. 4B, the outer terminals 7 are arranged next to each other to form an outer terminal group. In this example, the external terminal group includes the outer terminals 7 arranged in the X and Y directions in a matrix pattern on the back side of the electronic component 100. The arrangement of the outer terminals 7 is not limited to this. For example, the outer terminals 7 may be aligned in the X direction and/or the Y direction along the outer edge 205 of the base body 20.

The inner terminals 5 and the outer terminals 7 are electrically connected to each other by embedded portions 6 embedded in the base body 20 as internal wires. The electrodes 3 of the electronic device 10 included in the electronic component 100 are electrically connected to the inner terminals 5 of the container 50 by connection conductors 4. In this example, the electrodes 3 are connected to the inner terminals 5 by wire bonding, and the connection conductors 4 are metal wires (bonding wires). The electrodes 3 may instead be connected to the inner terminals 5 by flip-chip connection. In such a case, the electrodes 3 are provided on the back surface 102 of the electronic device 10, and the inner terminals 5 and the connection conductors 4 are disposed in the arrangement region 210. In this example, the outer terminals 7 are arranged in a land grid array (LGA). However, the outer terminals 7 may instead be arranged in a pin grid array (PGA), a ball grid array (BGA), or a leadless chip carrier (LCC). In such a case, the outer terminals 7 may be disposed on a back surface 206 of the base body 20 in an orthogonal projection region of the lid body 30 (region corresponding to the region LR in FIG. 1). Some of the outer terminals 7 may be disposed in an orthogonal projection region of the electronic device 10 (region corresponding to the region DR in FIG. 1). The inner terminals 5, the embedded portions 6, and the outer terminals 7 may be integrated together by using a lead frame. The inner terminals 5 serve as inner lead wires, and the outer terminals 7 serve as outer lead wires. In the case where the lead frame is used, the outer terminals 7 are located outside the orthogonal projection region of the base body 20 (region corresponding to the region BR in FIG. 1). The outer terminals 7 of the electronic component 100 are electrically connected to connection terminals of a wiring member, such as a printed wiring board, and the electronic component 100 is fixed to the wiring member. The outer terminals 7 disposed in the orthogonal projection region of the base body 20 (region corresponding to the region BR in FIG. 1) can be electrically connected to an external circuit by reflow soldering using a solder paste. Thus, the electronic component 100 is secondarily mounted on the wiring member to form an electronic module. The mounting method may be surface mounting. The electronic module may also be regarded as an electronic component. An electronic apparatus is produced by installing the electronic module into a housing.

The base body 20 has a recessed shape. More specifically, the base body 20 includes a plate-shaped portion that defines the bottom of a recess, and a frame-shaped portion provided on a peripheral region of the plate-shaped portion defines the sides of the recess. The integrated body of the base body 20 may be formed by stacking a plate member and a frame member, by metal molding, or by cutting. The base body 20 may be a conductor, such as a metal plate, as long as the inner terminals 5 and the outer terminals 7 can be insulated. However, the base body 20 is typically formed of an insulator. Although the base body 20 may be a flexible substrate, such as a polyimide substrate, the base body 20 may instead be a rigid substrate, such as a glass epoxy substrate, a composite substrate, a glass composite substrate, a Bakelite substrate, or a ceramic substrate. In particular, a ceramic substrate may be used, and the base body 20 may be formed of a multilayer ceramic body. The ceramic material may be, for example, silicon carbide, aluminum nitride, sapphire, alumina, silicon nitride, cermet, yttria, mullite, forsterite, cordierite, zirconia, or steatite.

Referring to FIGS. 5A and 5B, the peripheral region of the base body 20 having the recessed shape includes stage portions and step portions. The stage portions are portions that extend in the X and Y directions. The step portions are portions that extend in the Z direction between two stage portions at different heights in the Z direction.

The stage portion provided with the inner terminals 5 is defined as a reference stage portion 202. In this embodiment, as shown in FIG. 5A, an upper stage portion 204 is located closer to the outer edge of the package 50, that is, closer to the outer edge 205 of the base body 20, than the inner terminal groups in the Y direction. The upper stage portion 204 protrudes from the reference stage portion 202. In other words, the upper stage portion 204 is located closer to the lid body 30 than the reference stage portion 202 in the Z direction. A step portion 203 is located between the reference stage portion 202 and the upper stage portion 204. The step portion 203 faces the connection conductors 4 across a portion of the interior space 60.

In the example shown in FIGS. 5A and 5B, the base body 20 includes a lower stage portion 200 in addition to the reference stage portion 202 and the upper stage portion 204. The lower stage portion 200 is located farther from the outer edge 205 of the base body 20 than the inner terminal groups. In other words, the lower stage portion 200 is located further toward the center of the base body 20 than the inner terminal groups. The lower stage portion 200 is located below the reference stage portion 202 with a step portion 201 provided therebetween. In other words, the lower stage portion 200 is located farther from the lid body 30 than the inner terminal groups in the Z direction, and the step portion 201 is provided therebetween. The step portion 201 faces the outer edge 105 of the electronic device 10 across a portion of the interior space 60. The reference stage portion 202 is located between the upper stage portion 204 and the lower stage portion 200. Hence, the reference stage portion 202 may be referred to as an intermediate stage portion. As shown in FIG. 5B, the reference stage portion 202 is not provided between the lower stage portion 200 and the upper stage portion 204 in the X direction in which the inner terminals 5 are not provided. Instead, the step portion 203 is located between the upper stage portion 204 and the lower stage portion 200. Although an intermediate stage portion similar to that in the Y direction may also be provided between the upper stage portion 204 and the lower stage portion 200 in the X direction, such an intermediate stage portion that is free from the inner terminals 5 may unnecessarily increase the size of the package 50, and may therefore be omitted.

The lid body 30 that faces the electronic device 10 has a function of protecting the electronic device 10. If the electronic device 10 is an image pickup device or a display element that uses light, the lid body 30 is required to be transparent to the light (typically, visible light). The material of the lid body 30 may be, for example, plastic, glass, or quartz crystal. The lid body 30 may have antireflection coating or infrared cut coating on a surface thereof.

Figure 6A:
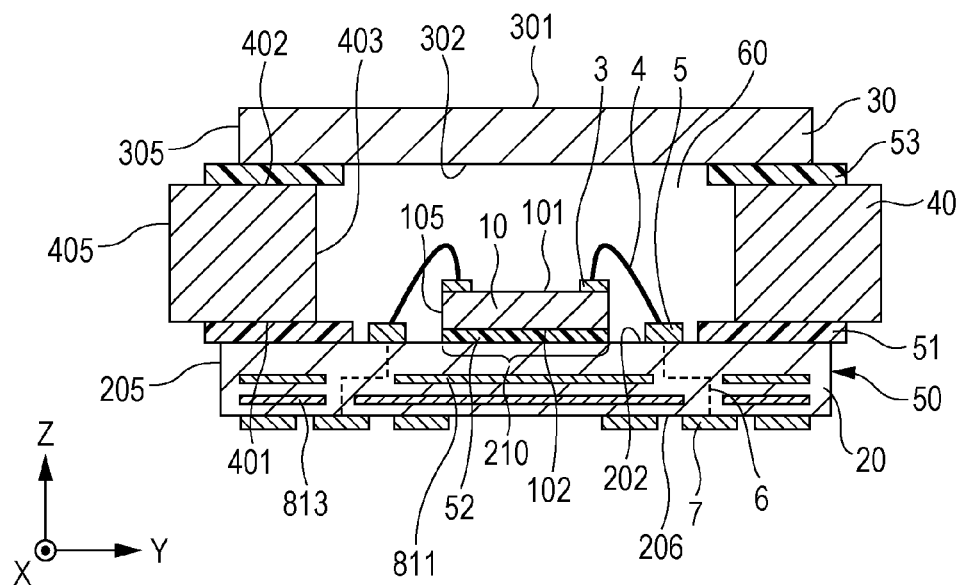
FIGS. 6A and 6B are schematic sectional views illustrating an example of the electronic component.
Figure 6B:
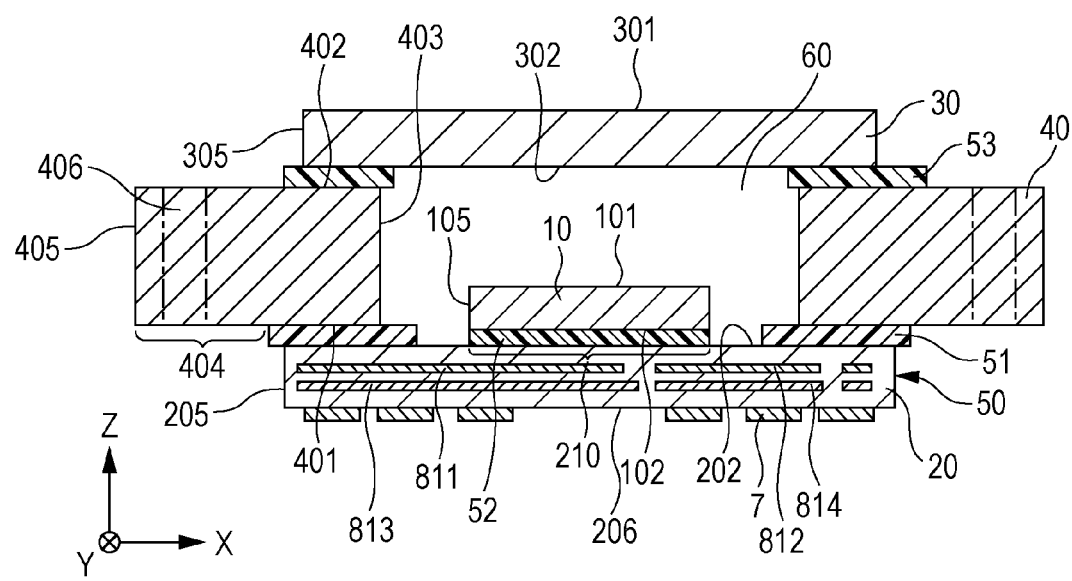

A modification of the electronic component 100 will now be described with reference to FIGS. 6A and 6B. FIGS. 6A and 6B are sectional views corresponding to FIGS. 5A and 5B, respectively. In the modification illustrated in FIGS. 6A and 6B, the base body 20 has a flat shape and has no step portion. Therefore, in this modification, a portion corresponding to the reference stage portion in FIGS. 5A and 5B serves also as the upper and lower stage portions. The electronic device 10 and the frame body 40 are fixed to the reference stage portion 202 on which the inner terminals 5 are arranged, and the lower stage portion 200 and the upper stage portion 204 illustrated in FIGS. 5A and 5B are not provided. Other than this point, the structure of this modification is similar to that of the electronic component 100 illustrated in FIGS. 5A and 5B.

Figure 7:
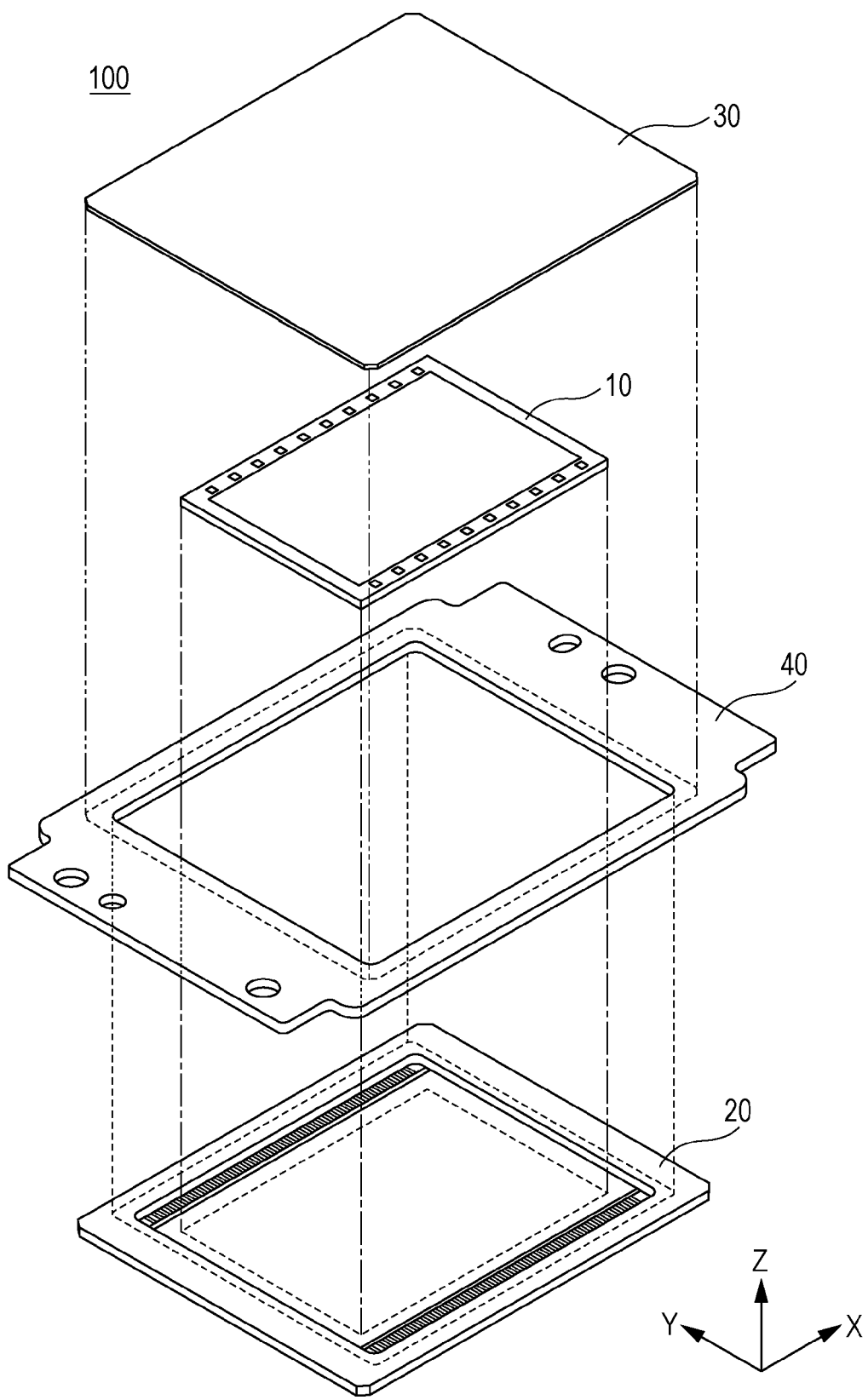
FIG. 7 is a schematic exploded perspective view illustrating an example of the electronic component.

FIG. 7 is an exploded perspective view of the electronic component 100. As it is clear from FIG. 7, the electronic component 100 is formed by stacking the electronic device 10, the base body 20, the lid body 30, and the frame body 40, which are prepared in advance, in the Z direction. In FIG. 7, the relationship between the base body 20 and the frame body 40 is shown by simple broken lines, the relationship between the electronic device 10 and the base body 20 is shown by single-dot chain lines, and the relationship between the frame body 40 and the lid body 30 is shown by double-dot chain lines. Also, the outline of the lid body 30 is shown by simple broken lines on the frame body 40, the outline of the electronic device 10 is shown by simple broken lines on the base body 20, and the outline of the frame body 40 is shown by simple broken lines on the base body 20.

The lid body 30 is fixed to the base body 20 with the frame body 40 provided therebetween. More specifically, as shown in FIGS. 5A and 5B, the frame body 40 and the base body 20 are bonded to each other by a bonding material 51. In addition, as shown in FIGS. 5A and 5B, the frame body 40 and the lid body 30 are bonded to each other by a bonding material 53. In this embodiment, the lid body 30 is located farther from the electronic device 10 and the base body 20 than the frame body 40 in the Z direction, and the bonding material 53 is provided on the inner surface 302 of the lid body 30 that faces the electronic device 10. However, as shown in FIG. 3 of Japanese Patent Laid-Open No. 2003-101042, a portion of the frame body 40 may be located farther from the electronic device 10 and the base body 20 than the lid body 30 in the Z direction, and the bonding material 53 may be provided on the outer surface 301 of the lid body 30. The thicknesses of the bonding materials 51, 52, and 53 may be in the range from 1 to 1000 μm, and is typically in the range of 10 to 100 μm.

More specifically, the frame body 40 and the base body 20 are bonded to each other by using an adhesive, the electronic device 10 and the base body 20 are bonded to each other by using an adhesive, and the lid body 30 and the frame body 40 are bonded to each other by using an adhesive. The order in which these members are bonded is not particularly limited.

However, the present invention is suitable for the case in which the frame body 40 and the base body 20 are bonded together before the lid body 30 and the frame body 40 are bonded together. In addition, the present invention is suitable for the case in which the frame body 40 and the base body 20 are bonded together before the electronic device 10 and the base body 20 are bonded together. Accordingly, first, the frame body 40 and the base body 20 are bonded together to form a mounting member. Then, the electronic device 10 is fixed to the mounting member, and the lid body 30 is bonded to the mounting member after that.

The base body 20 and the frame body 40 may be bonded together by the bonding material 51 over the entire circumference of the bonding surfaces thereof. The lid body 30 and the frame body 40 may also be bonded together by the bonding material 53 over the entire circumference of the bonding surfaces thereof. When the bonding regions extend over the entire circumference so that the interior space 60 around the electronic device 10 is hermetically sealed from the outside air, intrusion of foreign substances into the interior space 60 can be suppressed and the reliability can be increased. A sufficient amount of adhesive may be used to ensure sufficient hermeticity.

The above-described bonding materials 51, 52, and 53 are formed by solidifying the applied adhesive. The adhesive may be, for example, a drying solidification type that is solidified by evaporating a solvent, a chemical reaction type that is cured by polymerization of molecules with light or heat, or a thermal fusion (hot-melt) type that is solidified by being fixed from a molten state. The adhesive is typically a photo-curable resin that is cured with an ultraviolet ray or visible light, or a thermosetting resin that is cured with heat. A thermosetting resin may be used as an adhesive for forming the bonding material 51 and the bonding material 52, and a photo-curable resin may be used as an adhesive for forming the bonding material 53.

The frame body 40 includes a bonding surface 401 that faces the base body 20 and is bonded to the bonding material 51, and a bonding surface 402 that faces the lid body 30 and is bonded to the bonding material 53. The frame body 40 surrounds the interior space 60 between the electronic device 10 and the lid body 30. A surface of the frame body 40 that faces the interior space 60 and surrounds the interior space 60 is the inner edge 403. The outer edge 405 of the frame body 40 is exposed to the exterior space. In this example, the frame body 40 includes extension portions 404 that extend toward the exterior space in the X direction from the regions between the base body 20 and the lid body 30. Each extension portion 404 has a through hole 406. The through hole 406 may be used as a screw hole for fixing the extended portion 404 to a housing or the like of an electronic apparatus or as a positioning hole.

In this example, the extension portions 404 extend in the Y direction and are provided at the left and right sides. However, the extension portions 404 may instead extend in the X direction and be provided at the top and bottom sides. In addition, although the extension portions 404 extend in the Y direction, which is a direction perpendicular to the X direction in which the inner terminals 5 are arranged, the extension portions 404 may instead be arranged so as to extend in the direction in which the inner terminals 5 are arranged. In this example, the signal output lines of the main portion 1 (signal output lines 13 in FIG. 3) extend in the Y direction. The extension portions 404, which are ferromagnetic, can effectively reduce the magnetic field applied to the electronic device 10. Therefore, when the electronic device 10 is an image pickup device, the extension portions 404 may be arranged so as to extend in the Y direction along the signal output lines 13 that extend in the Y direction in the main portion 1 illustrated in FIG. 3. When the extension portions 404, which are ferromagnetic, are arranged so as to extend along the signal output lines of the main portion 1, the X-direction component of the magnetic field, that is, a magnetic field component that crosses the signal output lines, can be reduced, so that the noise can be reduced.

The material of the frame body 40 may either be a ceramic or a metal as long as the material is ferromagnetic. Here, the metal is not limited to an elemental metal and may instead be an alloy. In this embodiment, the frame body 40 and the base body 20 are bonded together by an adhesive, and the frame body 40 and the base body 20 may be made of different materials. In addition, the frame body 40 and the lid body 30 may be made of different materials. In such a case, for example, the material of the base body 20 is a non-ferromagnetic ceramic, the material of the lid body 30 is glass, and the material of the frame body 40 is a ferromagnetic metal or ceramic.

In the case where the frame body 40 has a high thermal conductivity, the frame body 40 can be used as a heat spreader, and heat of the electronic device 10 can be dissipated through the extension portions 404. From the viewpoint of heat dissipation, the thermal conductivity of the frame body 40 may be 1.0 W/m·K or more, and is preferably 10 W/m·K or more. The thermal conductivity of a typical resin is less than 1.0 W/m·K.

To reduce a stress generated in the electronic component 100, the coefficient of thermal expansion (coefficient of linear expansion) of the frame body 40 may be made as low as possible. Specifically, the coefficient of thermal expansion of the frame body 40 may be 50 ppm/K or less.

From the viewpoint of thermal conduction and thermal expansion, the material of the frame body 40 may be a metal. The material is typically a stainless steel or other iron alloy containing chromium, nickel, or cobalt. For example, SUS430, which is a ferritic stainless steel, a nano-crystal magnetic alloy, such as Permalloy, 42 alloy, Kovar, or Finemet (registered trademark), or an amorphous magnetic alloy may be used as the ferromagnetic body. A metal oxide such as ferrite may, of course, also be used.

The frame body 40 has a function of determining a gap between the electronic device 10 and the lid body 30 and a function of supporting the lid body 30. The frame body 40 may have screw holes or positioning holes as described above, and may also function as a heat dissipating member since it has a high thermal conductivity. Hence, the base body 20 and the frame body 40 may be referred to as mounting members.

The conductive films embedded in the base body 20 may be used as the conductor 88. Each of the first conductive film 811, the second conductive film 812, the third conductive film 813, and the fourth conductive film 814 illustrated in FIGS. 5A, 5B, 6A, and 6B functions as the conductor 88.

Figure 8A:
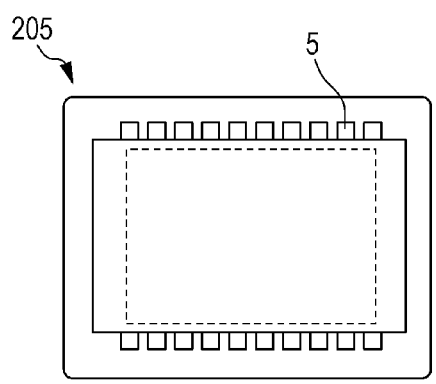
FIGS. 8A to 8D are schematic diagrams illustrating an example of the electronic component.
Figure 8B:
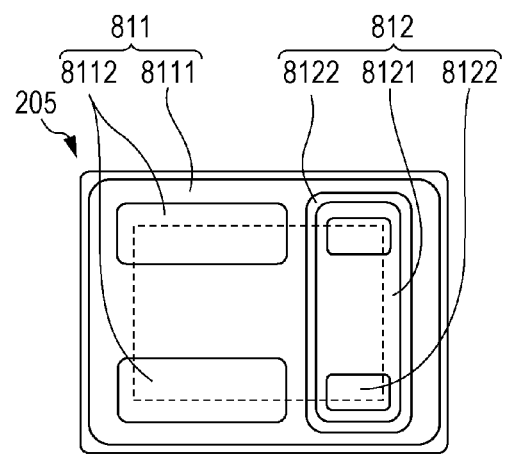
Figure 8C:
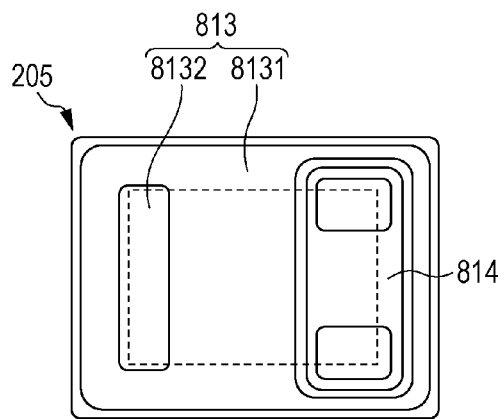
Figure 8D:
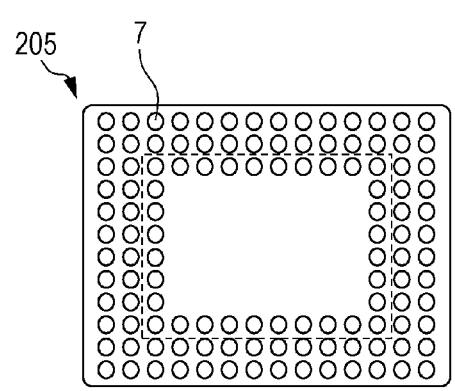

FIGS. 8A to 8D illustrate planar patterns of conductors related to the base body 20. FIG. 8A illustrates the inner terminals 5, and FIG. 8D illustrates the outer terminals 7. FIG. 8B illustrates the first conductive film 811 and the second conductive film 812 as the conductor 88, and FIG. 8C illustrates the third conductive film 813 and the fourth conductive film 814 as the conductor 88.

The first conductive film 811 and the second conductive film 812 are evenly spaced from the electronic device 10, and the third conductive film 813 and the fourth conductive film 814 are evenly spaced from the electronic device 10. The first conductive film 811 and the second conductive film 812 are closer to the electronic device 10 than the third conductive film 813 and the fourth conductive film 814. The distances from the electronic device 10 to the first conductive film 811, the second conductive film 812, the third conductive film 813, and the fourth conductive film 814 are smaller than the distance from the electronic device 10 to the outer terminals 7. The distance from the electronic device 10 to the base body 20 is smaller than the distances from the electronic device 10 to the first conductive film 811, the second conductive film 812, the third conductive film 813, and the fourth conductive film 814. Although two conductive films are provided as the conductors that are evenly spaced from the electronic device 10 in this example, the number of conductive films may instead be one or three or more. The conductive films that are evenly spaced from the electronic device 10 may be continuous over ½ or more of the area of the orthogonal projection region of the electronic device 10 (region corresponding to the region DR in FIG. 1), that is, the area of the electronic device 10, in total.

As is clear from FIGS. 5A, 5B, and 8A to 8D, at least a portion of each of the first to fourth conductive films is located in the orthogonal projection region of the electronic device 10 (region corresponding to the region DR in FIG. 1). In addition, each of the first to fourth conductive films extends into the orthogonal projection region of the frame body 40, which is a ferromagnetic body (region corresponding to the region FR in FIG. 1). The outline of the electronic device 10 is shown by dotted lines in each of FIGS. 8A to 8D. As is clear from FIGS. 8A to 8D, each of the conductive films 811, 812, 813, and 814, which serves as the conductor 88, is located only in the orthogonal projection region of the base body 20 (region corresponding to the region BR in FIG. 1) (region surrounded by the outer edge 205 of the base body 20), and does not extend to a region outside the orthogonal projection region (region corresponding to the region BR in FIG. 1). Although each conductive film has a single continuous sheet-shaped structure, the conductive film may have holes, slits, or the like for forming vias or wiring patterns included in the embedded portions 6. These holes, slits, or the like do not largely affect the above-described generation of the eddy current. Referring to FIGS. 8B and 8C, the conductive films include dense portions 8111, 8121, and 8131 in which the number of holes and slits is relatively small and the density of the conductor is high and light portions 8112, 8122, and 8132 in which the number of holes and slits is relatively large and the density of the conductor is low. The eddy current may be generated in a region in which the conductor is continuous over as large an area as possible. Therefore, the dense portions 8111, 8121, and 8131 may be arranged so that as large portions thereof as possible are located in the orthogonal projection region of the main portion 1 of the electronic device 10 (region corresponding to the region MR in FIG. 1). In such a case, the noise generated in the signal lines and the like of the main portion 1 can be reduced.

The inner terminals 5, the embedded portions 6, the outer terminals 7, the first conductive film 811, the second conductive film 812, the third conductive film 813, and the fourth conductive film 814 are integrated with the base body 20. The inner terminals 5 are provided on the reference stage portion 202 of the base body 20.

To form the base body 20 including the above-described conductive films, green sheets formed by a sheet forming method such as a doctor blade method or a calender roller method are subjected to a punching process to form plate-shaped sheets, and the plate-shaped sheets are stacked together to form a green ceramic plate member. In addition, green sheets formed by a similar method are subjected to a punching process to form frame-shaped sheets, and the frame-shaped sheets are stacked together to form a green ceramic frame member. The plate member and the frame member are stacked together and fired, so that a multilayer ceramic body having a recessed shape is formed. The inner terminals 5, the embedded portions 6, the outer terminals 7, the first conductive film 811, the second conductive film 812, the third conductive film 813, and the fourth conductive film 814 may be formed by firing conductive paste patterns that are formed by, for example, a screen printing method in the step of stacking the green sheets. The conductive paste may be, for example, tungsten paste, copper paste, or silver paste. From the viewpoint of thermal durability, tungsten paste may be used. The thickness of the thus-formed conductive films that function as the conductor 88 is about 1 to 100 μm, which is sufficient to form the eddy current.

The present embodiment will now be described in detail with reference to FIGS. 9A and 9B.

Figure 9A:
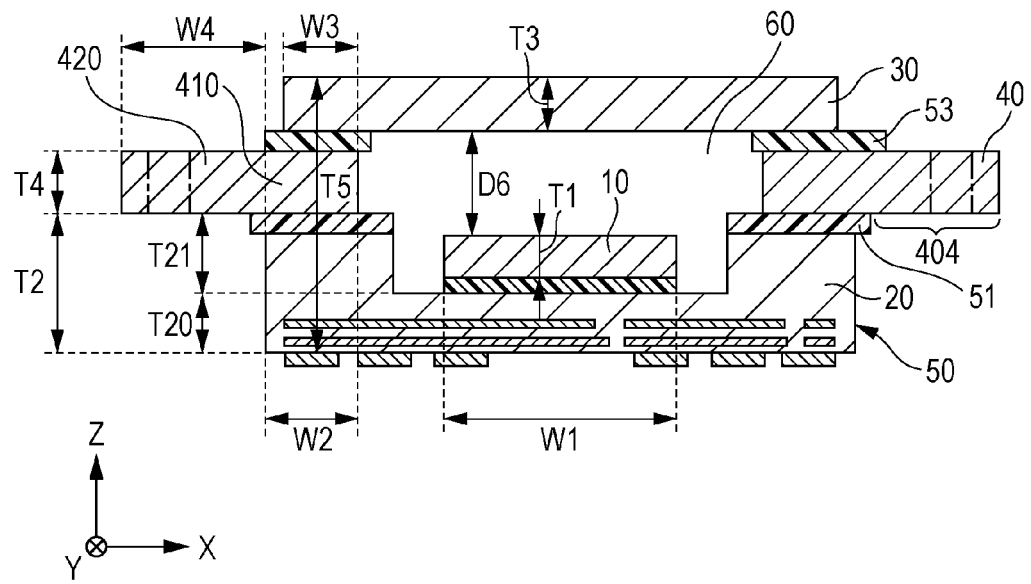
FIGS. 9A and 9B are schematic diagrams illustrating an example of the electronic component.
Figure 9B:
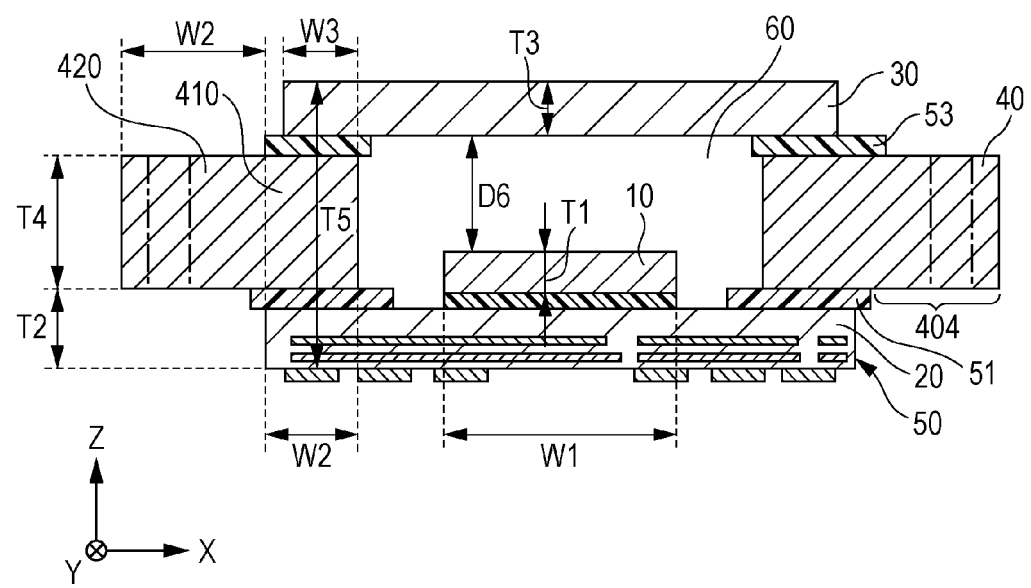

FIG. 9A is a sectional view of the same portion as that shown in FIG. 5B, and FIG. 9B is a sectional view of the same portion as that shown in FIG. 6B. These FIGS. show the dimensions of each member.

W1 represents the outer dimension of the electronic device 10 in the X direction. W2 represents the length of a portion (first portion 410) of the frame body 40 in the X direction, the portion being closer to the inner edge 403 of the frame body 40 than the outer edge 205 of the base body 20. The first portion 410 is a portion of the frame body 40 that is bonded to the base body 20. In the example illustrated in FIG. 9A, as shown in FIG. 5B, a surface of the first portion 410 is a region of the bonding surface 401 of the frame body 40, the region facing the base body 20 (the upper stage portion 204 in this case). W4 represents the length of a portion (second portion 420) of the frame body 40 in the X direction, the portion being closer to the outer edge 405 of the frame body 40 than the outer edge 205 of the base body 20. In the example illustrated in FIG. 9A, as shown in FIG. 5B, a surface of the second portion 420 is a region of the bonding surface 401 of the frame body 40, the region not facing the base body 20 (the upper stage portion 204 in this case). T4 represents the thickness of the frame body 40. In this example, the thickness T4 of the frame body 40 is substantially equal to the distance between a peripheral region of the base body 20 and a peripheral region of the lid body 30. The thicknesses of the bonding materials 51 and 53 are substantially negligible. In this embodiment, the thickness T4 of the frame body 40 is smaller than the length W2 of the first portion 410. In other words, a cross section of a portion of the frame body 40 located on the base body 20 has a rectangular shape in which the long-side direction is the X direction and the short-side direction is the Z direction. In this example, the first portion 410 and the second portion 420 have the same thickness. However, the thickness of the second portion 420 may be either greater or smaller than the thickness of the first portion 410 as long as the thickness of the first portion 410 is smaller than the length W2 of the first portion 410. To increase the thermal conductivity of the second portion 420, the thickness of the second portion 420 may be greater than the thickness of the first portion 410.

The frame body is connected to a housing or the like of an electronic apparatus. Therefore, if the frame body is too thin, sufficient rigidity cannot be ensured, and the positioning function and the function as a connecting member will be degraded. In addition, if the frame body is too thin, the thermal resistance will be increased and the heat dissipation performance will be degraded. If the frame body is too thick, although the rigidity can be increased and the heat dissipation performance can be improved, it becomes difficult to reduce the thickness of the electronic component. Accordingly, the thickness T4 needs to be set to an appropriate value, and may be about 0.5 mm to 1.2 mm.

With respect to the thickness T4 of the first portion 410 of the frame body 40, the length W2 of the first portion 410 is the length of a region in which the frame body 40 and the base body 20 are bonded together by the bonding material 51, and the thermal resistance is relatively high in this region since the bonding material is an adhesive. If the length W2 is too large, the heat transferring distance of the base body portion becomes too long and the heat dissipation performance may be degraded. If the length W2 is too small, the thermal conductivity of the adhesive portion, which has a relatively high thermal resistance as described above, will be reduced and the heat dissipation performance will be degraded. In addition, if the length W2 is too small, the adhesion between the base body 20 and the frame body 40 will be reduced, which leads to reductions in the reliability and thermal durability of the electronic component. Therefore, the length W2 of the first portion 410 also needs to be set to an appropriate value, and may be about 0.5 mm to 2.5 mm.

With regard to the above-described two parameters W2 and T4 that relate to the shape of the frame body 40 and the positional relationship between the frame body 40 and the base body 20, the thermal conductivity of the frame body 40 may be high in terms of the absolute value, and may be higher than that of the base body 20. This is because, in such a case, the thickness of the frame body 40 can be reduced within a range in which sufficient rigidity can be ensured, and reduction in the thickness of the electronic component can be achieved. The thickness T4 of the frame body 40 may qualitatively satisfy T4<W2. When T4<W2 is satisfied, the width may be set so that the thermal resistance of the adhesive portion can be reduced and reductions in the reliability and thermal durability of the electronic apparatus can be prevented.

Accordingly, the efficiency of thermal conduction by the frame body 40 can be increased while an increase in the thickness T5 of the electronic component 100 is suppressed. When W2>T4 is satisfied, the thermal resistances of the base body 20 and the frame body 40 can be reduced, and the heat can be efficiently transferred from the first portion 410 to the second portion 420. In particular, in the case where the outer terminals (LGA, LCC, etc.) are provided on one side of the base body as in this embodiment, the back surface is likely to be connected to a substrate having a relatively low thermal conductivity (glass epoxy substrate, polyimide substrate, etc.). Therefore, heat dissipation from the back surface of the substrate cannot be expected. For this reason, the configuration of this embodiment in which the frame body is utilized is particularly effective.

In this embodiment, as described above with reference to FIGS. 4A and 4B, the extension portions 404 are provided at both sides of the electronic device 10 in the X direction. Therefore, in the X direction, the width W4 of the second portion 420 of the frame body 40 is greater than the width W2 of the first portion 410 located between each extension portion 404 and the inner edge 403. The width W4 of the second portion 420 of the frame body 40 is the width of a portion connected to a housing or the like of an electronic apparatus by a connecting method that may be selected from various methods such as those using an adhesive or screws. The width W4 of the second portion 420 may be qualitatively greater than the width W2 of the first portion 410. When W4 is greater than W2, the thermal resistance of at least the portion having the width W4 that is connected to the housing or the like can be made lower than that in the region having the width W2, and the heat dissipation performance can be improved. When W4 is smaller than W2, the thermal resistance of the portion having the width W4 that is connected to the housing or the like is increased, and consequently, the temperature in the region having the width W2 is also increased. Since the adhesive is disposed in the region having the width W2, when the temperature is increased, deterioration of the adhesive may be accelerated. In this embodiment, the thickness T4 of the frame body 40 is smaller than the distance D6 between the lid body 30 and the electronic device 10 (distance between the inner surface 302 and the front surface 101). However, the thickness T4 may instead be greater than the distance D6. In the electronic component 100, the distance D6 of is required to be as large as a certain value to form a sufficiently large interior space 60. In this embodiment, since the frame body 40 is arranged so as to surround the interior space 60, the thickness of the electronic component 100 is not increased due to the frame body 40. In contrast, in a structure according to the related art in which a heat dissipating plate is embedded in the base body 20, the thickness of the base body 20 is increased by the thickness of the heat dissipating plate. In this embodiment, since the thickness T4 of the frame body 40 serves also as the distance D6, an increase in thickness of the electronic component 100 can be suppressed. In FIG. 9A, the thickness T2 of the base body 20 is increased by the thickness T21 of a frame member that forms the step portion 203. In the case where the thermal conductivity of the base body 20 is lower than the thermal conductivity of the frame body 40, T21 may be as small as possible, and T21<T1 may be satisfied. In such a case, the frame body 40 surrounds the electronic device 10.

The lid body 30 is bonded to the first portion 410 of the frame body 40. Hence, the thermal conductivity of the lid body 30 may be lower than the thermal conductivity of the frame body 40. When the thermal conductivity of the lid body 30 is low, the heat transferred from the base body 20 is more easily transferred to the second portion 420 than to the lid body 30 from the first portion 410. Therefore, the efficiency of heat dissipation at the second portion 420 is increased. The thermal conductivities of the base body 20 and the frame body 40 may, of course, be high, and may be higher than the thermal conductivity of the lid body 30. Also, the thermal conductivity of the frame body 40 may be higher than the thermal conductivity of the base body 20. The thermal conductivities of the base body 20 and the frame body 40 may be 2.0 W/m·K or more for practical use, and are preferably 10 W/m·K or more. The interior space 60 is located between the step portion 201 shown in FIG. 5A, which is provided between the upper stage portion 204 and the lower stage portion 200, and the outer edge 105 of the electronic device 10. The thermal conductance of a portion between the step portion 201 and the outer edge 105 may be increased. More specifically, a thermally conductive member that is in contact with the step portion 201 and the outer edge 105 of the electronic device 10 may be disposed between the step portion 201 and the outer edge 105 so as to fill the interior space 60 between the electronic device 10 and the outer edge 105. The thermally conductive member may be formed by solidifying conductive paste, such as silver paste or copper paste. Silver paste has an electrical conductivity of, for example, $1 \times 10^6$ to $1 \times 10^7$ (S/m). When the inner terminals 5 are located between the outer edge 105 of the electronic device 10 and the step portion 201, it may be difficult to use such a conductive paste from the viewpoint of ensuring sufficient insulation.

However, in this example, the inner terminals 5 are arranged on the reference stage portion 202 as described above with reference to FIG. 5A. Therefore, the conductive paste can be easily used.

Figure 10A:
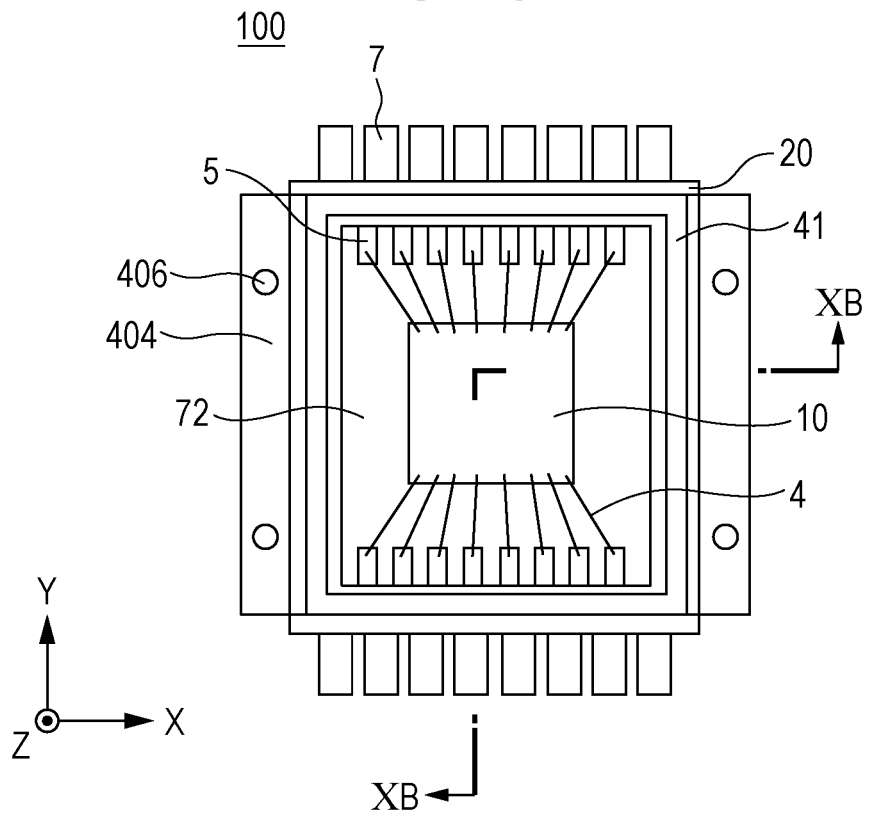
FIGS. 10A and 10B are schematic diagrams illustrating an example of the electronic component.

Another example of the electronic component 100 according to en embodiment of the present invention will be described with reference to FIGS. 10A and 10B. FIG. 10A is a plane view of the example of the electronic component 100, and FIG. 10B is a sectional view of the electronic component 100 taken along line XB-XB.

Also in this embodiment, a frame body 41 is used as the ferromagnetic body 44. A lead frame extends through a base body 20, which is made of a resin or ceramic. The lead frame includes inner lead wires that serve as inner terminals 5 and outer lead wires that serve as outer terminals 7. The frame body 41 is disposed between the lead frame and a lid body 30. The frame body 41 is embedded in the base body 20 in a region above the lead frame. Therefore, the frame body 41 is located only in the orthogonal projection region (region corresponding to the region BR in FIG. 1) of the base body 20, and does not extend to the outside of the orthogonal projection region (region corresponding to the region BR in FIG. 1). Thus, the frame body 41, which serves as the ferromagnetic body 44, may be covered by the base body 20 instead of being exposed. Alternatively, the frame body 41 may be sandwiched by the base body 20 and the lid body 30.

Figure 10B:
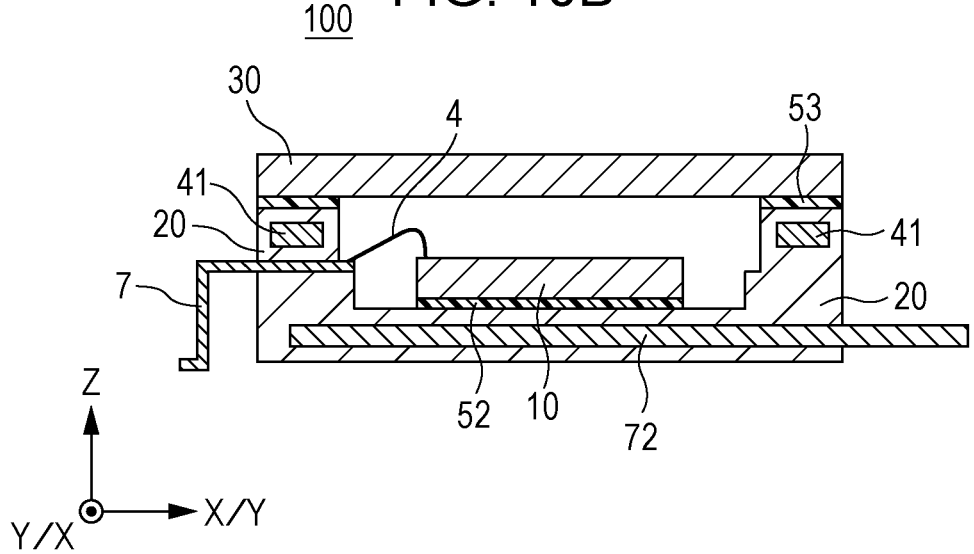

In the example illustrated in FIGS. 10A and 10B, a conductive plate 72, which serves as the conductor 88 in FIG. 1, extends from a position inside the orthogonal projection region of the electronic device 10 (region corresponding to the region DR in FIG. 1) to a position inside the orthogonal projection region of the frame body 41 (region corresponding to the region FR in FIG. 1). The conductive plate 72 according to the present embodiment is thicker than the conductive films 811, 812, 813, and 814 illustrated in FIGS. 5A and 5B. The conductive plate 72 is a metal plate having a thickness of, for example, 0.1 mm to 2.0 mm, and is sufficiently rigid. The material of the conductive plate 72 may be a non-ferromagnetic metal, such as aluminum, copper, or an austenitic stainless steel such as SUS304. The conductive plate 72, which is sufficiently rigid, extends to a region outside the orthogonal projection region of the base body 20 (region corresponding to the region BR in FIG. 1). The conductive plate 72 includes extension portions 404 that protrude from the base body 20, and fixing through holes 406 are formed in the extension portions 404. The fixing through holes 406 are used for screw fastening or positioning to secure the electronic component 100.

Figure 11A:
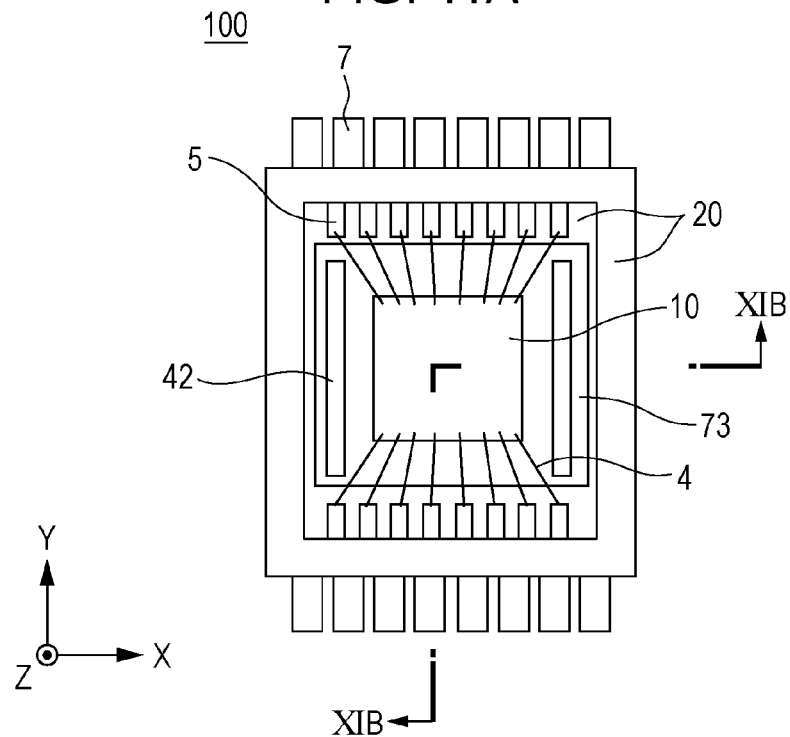
FIGS. 11A and 11B are schematic diagrams illustrating an example of the electronic component.

Another example of the electronic component 100 according to en embodiment of the present invention will be described with reference to FIGS. 11A and 11B. FIG. 11A is a plane view of the example of the electronic component 100, and FIG. 11B is a sectional view of the electronic component 100 taken along line XIB-XIB.

In this example, the ferromagnetic body 44 is located closer to the electronic device 10 than the inner terminals 5 provided as inner lead wires. Rod members 42, which are provided as the ferromagnetic body 44, face side surfaces of an electronic device 10, and upper surfaces of the rod members 42 are below the front surface 101 of the electronic device 10. In this example, the ferromagnetic body 44 is not a frame body but is a pair of rod members 42 arranged along two opposing sides of the electronic device 10. However, a frame body may instead be provided so as to surround the electronic device 10 at a position closer to the electronic device 10 than the inner terminals 5 that serve as inner lead wires. In this case, it is not necessary that the ferromagnetic body 44 surround the region between the electronic device 10 and the lid body 30. The two rod members 42 are arranged along the signal output lines (the signal output lines 13 illustrated in FIG. 3) that extend in the Y direction. When the rod members 42, which serve as the ferromagnetic body, extend along the signal output lines of the main portion 1, the X-direction component of the magnetic field, that is, a magnetic field component that crosses the signal output lines, can be reduced, so that the noise can be reduced.

Figure 11B:
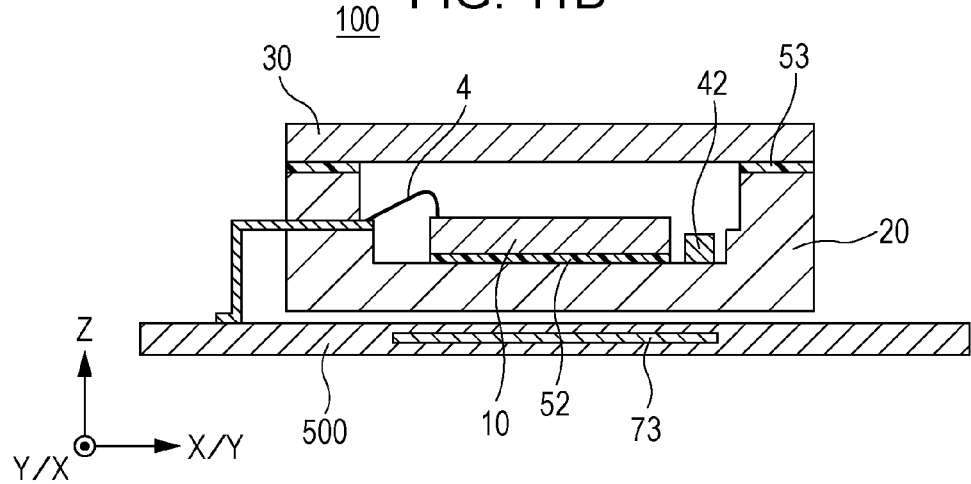

In the example illustrated in FIGS. 11A and 11B, a conductive film 73, which serves as the conductor 88, extends from a position inside the orthogonal projection region of the electronic device 10 (region corresponding to the region DR in FIG. 1) to positions inside the orthogonal projection regions of the rod members 42 (regions corresponding to the region FR in FIG. 1). The conductor film 73 is provided on a wiring board 500 on which the electronic component 100 is mounted. Thus, the conductor 88 may be separated from the base body 20. When the distance between the conductor 88 and the electronic device 10 is increased, the magnetic field generated by the eddy current is reduced and it becomes difficult to achieve sufficient effect. A base body 20 having a small thickness may be used so that the distance between the conductor 88 and the electronic device 10 is 1.0 mm or less.

EXAMPLE

An example of the present invention will now be described. The electronic component 100 illustrated in FIGS. 5A and 5B was manufactured. The electronic component 100 had a rectangular plate shape with the X direction being the long-side direction and the Y direction being the short-side direction.

A base body having a rectangular recess and in which three alumina ceramic layers were stacked was prepared as the base body 20 of the electronic component 100. The thermal conductivity of the alumina ceramic was 14 W/m·K. In the base body 20, the thickness of a plate-shaped first layer was 0.8 mm, the thickness of a frame-shaped second layer (height of the step portion 201) was 0.4 mm, and the thickness of a frame-shaped third layer (the height of the step portion 203) was 0.2 mm.

The outer dimension of the first layer in the X direction was 32.0 mm. The outer dimension of the first layer in the Y direction was 26.4 mm. The outer and inner dimensions of the second layer in the X direction were 32.0 mm and 26.2 mm, respectively (frame width was 2.9 mm). The outer and inner dimensions of the second layer in the Y direction were 26.4 mm and 19.6 mm, respectively (frame width was 3.4 mm). The outer and inner dimensions of the third layer in the X direction were 32.0 mm and 26.2 mm, respectively (frame width was 2.9 mm). The outer and inner dimensions of the third layer in the Y direction were 26.4 mm and 21.4 mm, respectively (frame width was 2.5 mm). The width in the Y direction of the reference stage portion 202 provided with the inner terminals 5 was 0.9 mm.

Multilayer films formed by plating a nickel base with gold were used as the inner terminals 5 and the outer terminals 7. The outer terminals 7 were of the LGA type, and 125 outer terminals 7 were provided. Metal films having a relatively large area similar to the first conductive film 811, the second conductive film 812, the third conductive film 813, and the fourth conductive film 814 illustrated in FIGS. 8A to 8D were formed in the first layer. The metal films were made of tungsten films (relative permeability: 1, electrical conductivity: $1.8 \times 10^7$ (S/m)) having a thickness of 10 μm. The first conductive film 811 and the third conductive film 813 extend to a position that is 1.0 mm or less to the outer edge 205 of the base body 20.

Next, the frame body 40 made of SUS430 (18% chromium stainless steel), which is a ferritic stainless steel, was prepared as the ferromagnetic body, and thermosetting resin was applied as an adhesive to one surface of the frame body 40 by screen printing. The thermal conductivity of SUS430 is 26 W/m·K. The frame body 40 was mounted on the upper stage portion 204 of the base body 20, and a pressure was applied. The pressure was adjusted so that the thickness of the thermosetting resin was set to 10 to 50 μm. Then, the thermosetting resin, which serves as the adhesive, was hardened by heating the thermosetting resin to about 120° C. to 150° C. To increase the adhesion between the front surface of the frame body 40 and the thermosetting resin, the front surface was subjected to a sandblasting process to obtain a surface roughness Ra of about 0.1 to 0.2 μm, so that front surface has projections and recesses. The thickness of the frame body 40 was 0.8 mm, the outer dimension thereof in the X direction was 42.0 mm (the width of each of the extension portions 404 provided at the left and right sides was 4.5 mm), and the inner dimension thereof in the X direction was 27.4 mm. The outer and inner dimensions of the frame body 40 in the Y direction were 27.4 mm and 22.6 mm, respectively. The offset distance between the inner edge 403 of the frame body 40 and the step portion 203 of the base body 20 was 0.60 mm at each of the left and right sides in the X direction, and 0.60 mm at each of the upper and lower sides in the Y direction. Since the inner edge 403 was larger than the step portion 203, the entire circumference of the inner edge 403 was located further toward the outside (outer-edge-205 side) than the step portion 203. Also, the frame body 40 protrudes from the outer edge 205 of the base body 20 by 0.50 mm at a minimum and 5.0 mm (distance corresponding to the dimension of the extension portions 404) at a maximum at each of the left and right sides in the X direction, and by 0.50 mm at each of the upper and lower sides in the Y direction. In other words, W4 in the X direction was 0.50 mm at a minimum, but was 5.0 mm at the extension portions 404 so that W4>W2 was satisfied. Since the outer edge 405 was larger than the outer edge 205, the entire circumference of the outer edge 405 was located further toward the outside (outer-edge-205 side) than the outer edge 205. The length W2 of the first portion 410 was 2.3 mm in the X direction and 1.9 mm in the Y direction. In this way, a mounting member was obtained. In the X direction and Y direction, T4<W2 was satisfied. In the X direction, T4<W2<W4 was satisfied. In the Y direction, T4>W4 was satisfied.

Next, a CMOS image sensor having a so-called advanced photo system type-C (APS-C) size was prepared as the electronic device 10. The outer dimension of the electronic device 10 in the Y direction was 18.0 mm, and the thickness thereof was 0.75 mm. The thermal conductivity of the electronic device 10, which was made mainly of silicon, may be assumed to be 160 W/m·K, and the coefficient of thermal expansion thereof may be assumed to be 2.5 ppm/K. This electronic device 10 was fixed to a substantially central portion of the base body 20 by a thermosetting process using a black die bonding adhesive. Then, the electrodes 3 disposed in the peripheral region of the chip and the inner terminals 5 were electrically connected to each other with metal wires by using a wire bonding apparatus. The distance between the outer edge 105 of the electronic device 10 and the inner edge 403 of the frame body 40 was 1.5 mm in the X direction and 2.3 mm in the Y direction. The distance between the electronic device 10 and the step portion 203 was 0.9 mm in the X direction and 1.7 mm in the Y direction. The distance from the inner terminals 5 to the outer edge 105 of the electronic device 10 was 0.8 mm.

Next, an α-ray proofed plate member made of borosilicate glass having a thickness of 0.5 mm was prepared as the lid body 30. The thermal conductivity of borosilicate glass is about 1.4 W/m·K. The dimensions of the lid body 30 in the X direction and Y direction were 31.8 mm and 26.3 mm, respectively, and were substantially equal to the outer dimensions of the base body 20. An ultraviolet-curable resin as an adhesive was applied to one surface of the lid body 30 with a dispenser to form a frame-shaped pattern. The lid body 30 was mounted on the frame body 40 such that the surface having the adhesive applied thereto faced the bonding surface 402 of the frame body 40, and an appropriate pressure was applied. Spherical particles having a diameter of 30 μm were mixed in the adhesive as spacers, so that the thickness of the adhesive layer was set to about 30 μm. In this process, it was confirmed that the adhesive protruded from the space between the lid body 30 and the frame body 40. Then, a photo-curing process was performed by irradiating the adhesive with ultraviolet rays through the lid body 30. Then, as a post-curing process, a thermosetting process was performed to harden the adhesive, and thus the bonding material 53 was formed. The distance between the front surface 101 of the electronic device 10 and the inner surface 302 of the lid body 30 was 0.75 mm. In this way, the electronic component 100 having a thickness of 2.8 mm was obtained.

Then, the wiring member 500 of an appropriate size was prepared, and a solder paste was applied to connection terminals on the wiring member 500 by printing. The solder paste was melted in a reflow oven, and thus the electronic component 100 was fixed to the wiring member 500. In this way, an electronic module (image pickup module) was obtained.

The electronic module was disposed in a housing and was fastened to the housing with screws by using the through holes 406 formed in the extension portions 404 of the electronic component 100, so that the extension portions 404 were in close contact with the housing. In this way, a camera was manufactured as an electronic apparatus. When the camera was operated, appropriate images with low noise were obtained.

According to the above-described embodiment, an electronic component in which generation of noise is suppressed can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-039448, filed Feb. 28, 2013 which is hereby incorporated by reference herein in its entirety.

What is claimed is:
1. An electronic component comprising:
an electronic device, wherein a plane which is located between a front surface and a back surface of the electronic device and extends through a side surface of the electronic device without extending through the front surface or the back surface, is defined as a reference plane;
a lid body that is provided at the front-surface side of the reference plane and that overlaps the electronic device in a direction perpendicular to the reference plane;

a base body that is provided at the back-surface side of the reference plane and to which the electronic device is fixed;

an outer terminal that is provided at the back-surface side of the reference plane and that overlaps the base body in the direction perpendicular to the reference plane, the outer terminal being electrically connected to an electrode of the electronic device through an inner terminal;

a ferromagnetic body that is provided at the front-surface side of the reference plane and located outside a region that overlaps the electronic device in a direction perpendicular to the reference plane, and is not located inside a region that overlaps a portion of the electronic device in the direction perpendicular to the reference plane; and a conductor that is provided at the back-surface side of the reference plane and that overlaps the portion of the electronic device in the direction perpendicular to the reference plane, wherein the ferromagnetic body overlaps the base body in the direction perpendicular to the reference plane, and wherein the ferromagnetic body extends to a region outside a region that overlaps the base body in the direction perpendicular to the reference plane.

2. The electronic component according to claim 1, wherein the ferromagnetic body overlaps the conductor in the direction perpendicular to the reference plane.

3. The electronic component according to claim 1, wherein the base body is a multilayer ceramic body and the conductor is embedded in the base body.

4. The electronic component according to claim al, wherein the ferromagnetic body is a frame body that surrounds a space between the lid body and the electronic device.

5. The electronic component according to claim 1, wherein a dimension of the ferromagnetic body in a plane parallel to the reference plane is greater than a dimension of the ferromagnetic body in the direction perpendicular to the reference plane.

6. The electronic component according to claim 1, wherein the ferromagnetic body overlaps the lid body, and does not overlap the electronic device in the direction perpendicular to the reference plane.

7. The electronic component according to claim 1, wherein an electrical conductivity of the conductor is $1\times10^6$ (S/m) or more.

8. The electronic component according to claim 1, wherein the conductor is continuous over 1/2 or more of an area of the electronic device in the region that overlaps the electronic device.

9. The electronic component according to claim 1, wherein the conductor is separated from the electronic device, and a distance between the conductor and the electronic device is 1.0 mm or less.

10. The electronic component according to claim 1, wherein the conductor is separated from the electronic device, and a distance between the conductor and the electronic device is smaller than a distance between the outer terminal and the electronic device.

11. The electronic component according to claim 1, wherein the ferromagnetic body is a stainless steel.

12. The electronic component according to claim 1, wherein the electronic device is an image pickup device or a display device.

13. The electronic component according to claim 1, wherein the lid body is transparent to visible light.

14. The electronic component according to claim 1, wherein the electronic device is fixed to the base body with a bonding material other than the conductor, the bonding material being interposed between the electronic device and the base body.

15. The electronic component according to claim 1, wherein the outer terminal is arranged in a land grid array (LGA), a pin grid array (PGA), a ball grid array (BGA), or in manner of a leadless chip carrier (LCC).

16. The electronic component according to claim 1, wherein the base body has a lower stage portion and an upper stage portion, the lower stage portion including an arrangement region which overlaps the electronic device in the direction perpendicular to the reference plane, the upper stage portion being located in a periphery of the lower stage portion in a direction parallel to the reference plane, and being located closer to the lid body than the lower stage portion in the direction perpendicular to the reference plane, and wherein a portion of the ferromagnetic body is positioned between the upper stage portion and the lid body.

17. The electronic component according to claim 16, wherein the base body has an intermediate stage portion located between the upper stage portion and the lower stage portion, and the intermediate stage portion is provided with the inner terminal.

18. The electronic component according to claim 1, wherein the ferromagnetic body has a through hole outside the region where the ferromagnetic body overlaps the base body in the direction perpendicular to the reference plane.

19. An electronic component comprising:

an electronic device, wherein a plane which is located between a front surface and a back surface of the electronic device and extends through a side surface of the electronic device without extending through the front surface or the back surface, is defined as a reference plane;

a lid body that is provided at the front-surface side of the reference plane and that overlaps the electronic device in a perpendicular to the reference plane;

a base body that is provided at the back-surface side of the reference plane and to which the electronic device is fixed with a bonding material;

an outer terminal that is provided at the back-surface side of the reference plane and that overlaps the base body in the direction perpendicular to the reference plane, the outer terminal being electrically connected to an electrode of the electronic device through an inner terminal;

a ferromagnetic body that is provided at the front-surface side of the reference plane and located outside a region that overlaps the electronic device in a direction perpendicular to the reference plane; and a conductor that is provided at the back-surface side of the reference plane and that overlaps the electronic device in the direction perpendicular to the reference plane, wherein the conductor is separated from the electronic device and a distance between the conductor and the electronic device is smaller than a distance between the outer terminal and the electronic device, and wherein the conductor is paramagnetic or diamagnetic, and a magnetic permeability of the conductor is lower than a magnetic permeability of the ferromagnetic body.

20. An electronic apparatus comprising:
the electronic component according to claim 1; and
a coil.

* * * * *